(12) United States Patent
Ho

(10) Patent No.: US 12,131,908 B2
(45) Date of Patent: Oct. 29, 2024

(54) SEMICONDUCTOR STRUCTURE WITH AIR GAP IN PATTERN-DENSE REGION AND METHOD OF MANUFACTURING THE SAME

(71) Applicant: NANYA TECHNOLOGY CORPORATION, New Taipei (TW)

(72) Inventor: Jar-Ming Ho, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/383,158

(22) Filed: Oct. 24, 2023

(65) Prior Publication Data

US 2024/0055261 A1 Feb. 15, 2024

Related U.S. Application Data

(60) Division of application No. 18/220,963, filed on Jul. 12, 2023, which is a continuation-in-part of application No. 17/516,698, filed on Nov. 2, 2021, now Pat. No. 11,742,209, which is a division of application No. 16/857,879, filed on Apr. 24, 2020, now Pat. No. 11,309,186.

(51) Int. Cl.
| | |
|---|---|
| *H10B 12/00* | (2023.01) |
| *H01L 21/285* | (2006.01) |
| *H01L 21/3213* | (2006.01) |
| *H01L 21/768* | (2006.01) |
| *H01L 23/532* | (2006.01) |
| *H01L 23/544* | (2006.01) |

(52) U.S. Cl.
CPC .... *H01L 21/28506* (2013.01); *H01L 21/3213* (2013.01); *H01L 21/7682* (2013.01); *H01L 23/5329* (2013.01); *H01L 23/544* (2013.01); *H10B 12/00* (2023.02); *H10B 12/09* (2023.02); *H10B 12/50* (2023.02)

(58) Field of Classification Search
CPC ........ H10B 12/00; H10B 12/01; H10B 12/02; H10B 12/30; H10B 12/50
See application file for complete search history.

(56) References Cited

U.S. PATENT DOCUMENTS

2012/0007165 A1* 1/2012 Lee ................. H01L 29/7881
257/E27.06

* cited by examiner

*Primary Examiner* — Reema Patel
(74) *Attorney, Agent, or Firm* — Xuan Zhang

(57) ABSTRACT

The present disclosure provides a semiconductor structure, which includes: a first conductive layer arranged over a substrate; a dielectric layer arranged over the first conductive layer; a plurality of first conductive plugs penetrating through the dielectric layer; a plurality of spacers surrounding the respective first conductive plugs; a lining layer covering the dielectric layer, the spacer and the first conductive plugs, wherein the lining layer and the first conductive plugs include manganese (Mn); a second conductive plug penetrating through the lining layer; and a second conductive layer over the lining layer and the second conductive plug.

8 Claims, 40 Drawing Sheets

SEMICONDUCTOR STRUCTURE WITH AIR GAP IN PATTERN-DENSE REGION AND METHOD OF MANUFACTURING THE SAME

CROSS-REFERENCE TO RELATED APPLICATION

This application is a divisional application of U.S. Non-Provisional application Ser. No. 18/220,963 filed Jul. 12, 2023, which is a continuation-in-part application of U.S. Non-Provisional application Ser. No. 17/516,698 filed Nov. 2, 2021, which is a divisional application of U.S. Non-Provisional application Ser. No. 16/857,879 filed Apr. 24, 2020, which is incorporated herein by reference in its entirety.

TECHNICAL FIELD

The present disclosure relates to a semiconductor structure, and more particularly, to a method for preparing a semiconductor structure with an air gap for reducing capacitive coupling in a pattern-dense region and a semiconductor structure resulting therefrom.

DISCUSSION OF THE BACKGROUND

Semiconductor structures are essential for many modern applications. With the advancement of electronic technology, semiconductor structures are becoming smaller in size while providing greater functionality and including greater amounts of integrated circuitry. Due to the miniaturized scale of semiconductor structures, various types and dimensions of semiconductor structures providing different functionalities are integrated and packaged into a single module. Furthermore, numerous manufacturing operations are implemented for integration of various types of semiconductor structures.

However, the manufacturing and integration of semiconductor structures involve many complicated steps and operations. Integration in semiconductor structures becomes increasingly complicated. An increase in complexity of manufacturing and integration of the semiconductor structure may cause deficiencies, such as increased parasitic capacitance between adjacent conductive elements, which results in increased power consumption and unwanted resistive-capacitive (RC) delay (i.e., signal delay), especially in a pattern-dense region. Accordingly, there is a continuous need to improve the manufacturing process of semiconductor structures so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one aspect of the present disclosure, a semiconductor structure includes: a first conductive layer arranged over a substrate; a dielectric layer arranged over the first conductive layer; a plurality of first conductive plugs penetrating through the dielectric layer; a plurality of spacers surrounding the respective first conductive plugs; a lining layer covering the dielectric layer, the spacer and the first conductive plugs, wherein the lining layer and the first conductive plugs include manganese (Mn); a second conductive plug penetrating through the lining layer; and a second conductive layer over the lining layer and the second conductive plug.

In another aspect of the present disclosure A semiconductor structure includes: a first conductive layer arranged over a substrate; a second conductive layer arranged over the first conductive layer; a plurality of first conductive plugs arranged over a pattern-dense region of the substrate and between the first conductive layer and the second conductive layer; a plurality of spacers arranged on sidewalls of the respective first conductive plugs; a plurality of air gaps arranged between the spacers; and a plurality of second conductive plugs arranged over a pattern-loose region of the substrate and between the first conductive layer and the second conductive layer.

In yet another aspect of the present disclosure, a method of manufacturing a semiconductor structure includes: forming a first conductive layer over a substrate; forming a first dielectric layer over the first conductive layer; form a first opening and a second opening in the first dielectric layer, wherein the first opening is in a pattern-dense region and the second opening is in a pattern-loose region; depositing a plurality of first conductive plugs in the first opening; depositing a lining layer over the first conductive plugs and the first dielectric layer, wherein the lining layer lines a sidewall and a bottom of the second opening; forming a second conductive plug in a remaining portion of the second opening; and forming a second conductive layer over the lining layer and the second conductive plug.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
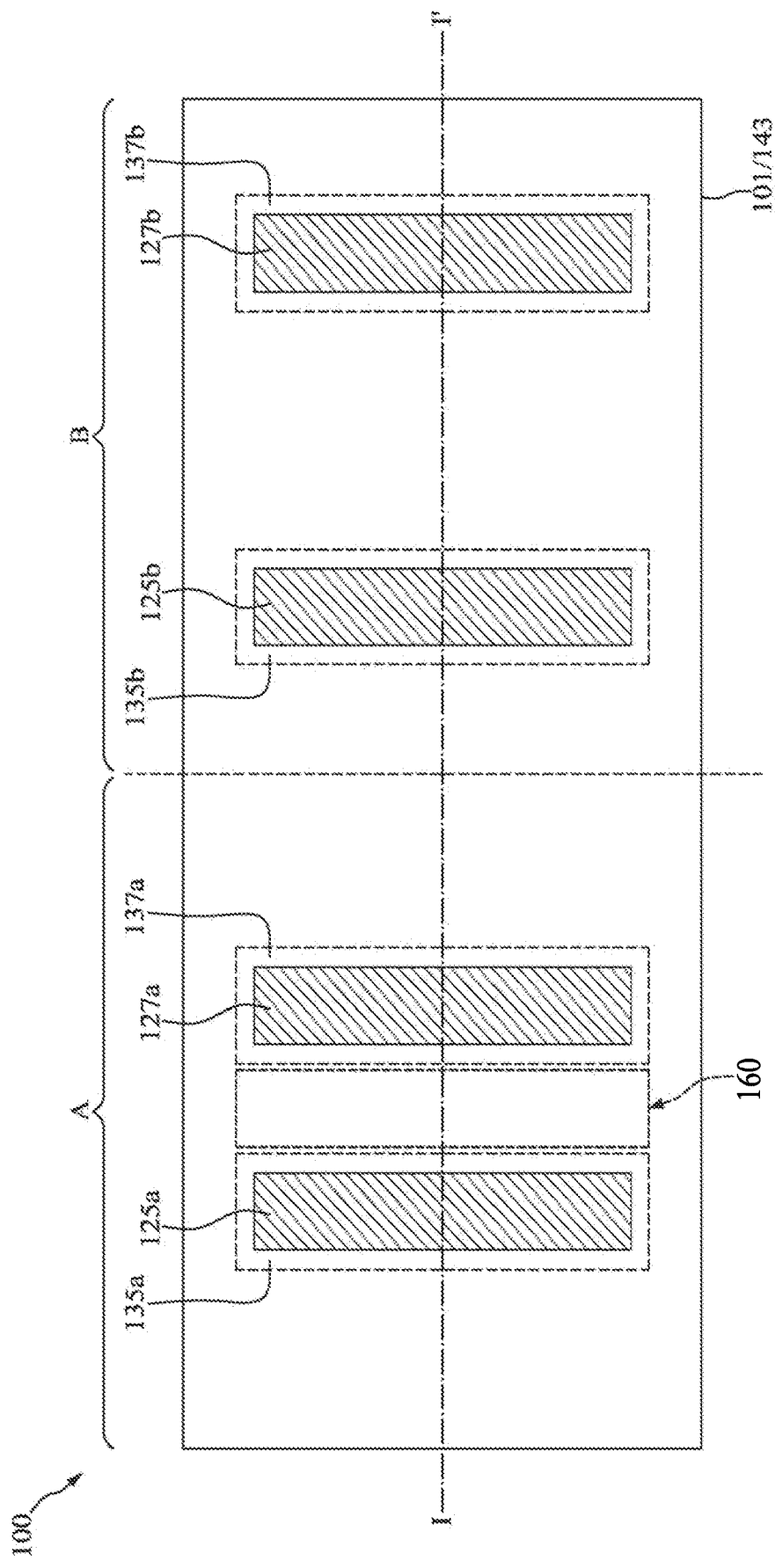
FIG. 1 is a top view illustrating a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
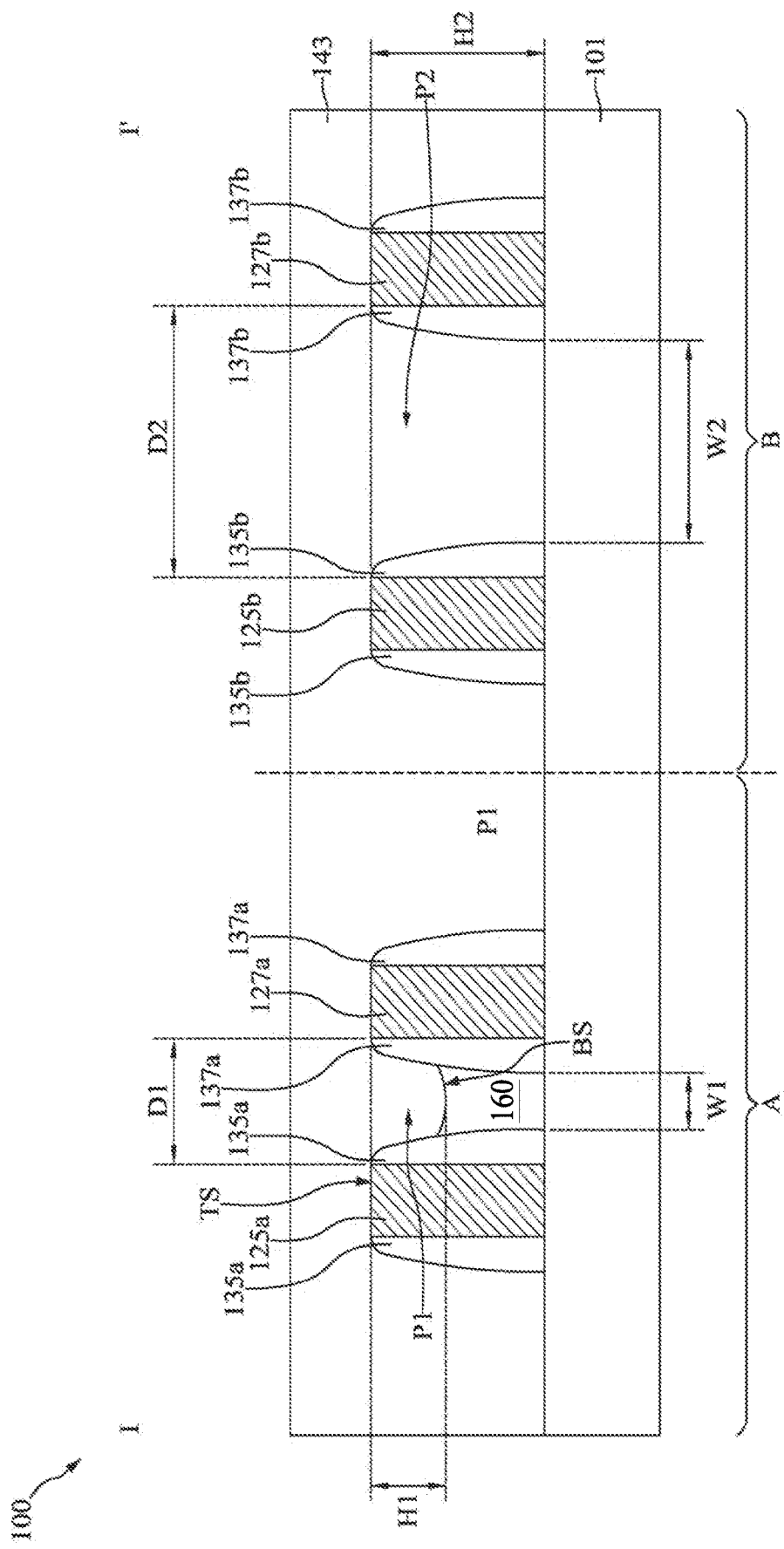
FIG. 2 is a cross-sectional view illustrating the semiconductor structure along the sectional line I-I' in FIG. 1, in accordance with some embodiments.

FIG. 1 is a top view illustrating a semiconductor structure 100, and FIG. 2 is a cross-sectional view illustrating the semiconductor structure 100 along the sectional line I-I' in FIG. 1, in accordance with some embodiments. In some embodiments, the semiconductor structure 100 includes a semiconductor substrate 101, conductive features 125a, 125b, 127a, 127b, spacers 135a, 135b, 137a, 137b, and a dielectric layer 143, as shown in FIGS. 1 and 2 in accordance with some embodiments. In some embodiments, the conductive features 125a, 125b, 127a, 127b are conductive wires such as interconnects or bit lines, configured to electrically connecting two conductive terminals laterally separated from each other. In some embodiments, the conductive features 125a, 125b, 127a, 127b are conductive plugs or metal plugs, such as bit line plug or capacitor plug, configured to electrically connecting two conductive terminals vertically separated from each other. The conductive features 125a, 125b, 127a, 127b are elaborated in connection with following figures, using the conductive plugs as examples.

In some embodiments, isolation structures (not shown) are arranged in the semiconductor substrate 101, and active areas (not shown) are defined by the isolation structures in the semiconductor substrate 101. Each of the active areas may include source/drain (S/D) regions. In some embodiments, the semiconductor substrate 101 has a pattern-dense region "A" and a pattern-loose region "B", the conductive plugs 125a and 127a are arranged over the pattern-dense region "A", and the conductive plugs 125b and 127b are arranged over the pattern-loose region "B". It should be noted that the distance D1 between the conductive plugs 125a and 127a is less than the distance D2 between the conductive plugs 125b and 127b. No obvious interfaces exist between the pattern-dense region "A" and the pattern-loose region "B". The dashed lines shown in FIGS. 1 and 2 are used to clarify the disclosure.

The spacers 135a and 137a are arranged over the pattern-dense region "A", and the spacers 135b and 137b are arranged over the pattern-loose region "B". In some embodiments, the conductive plug 125a is surrounded by the spacer 135a, the conductive plug 127a is surrounded by the spacer 137a, the conductive plug 125b is surrounded by the spacer 135b, and the conductive plug 127b is surrounded by the spacer 137b. The dielectric layer 143 is arranged over the pattern-dense region "A" and the pattern-loose region "B".

Specifically, the conductive plugs 125a, 125b, 127a, 127b and the spacers 135a, 135b, 137a, 137b over the pattern-dense region "A" and the pattern-loose region "B" are covered by the dielectric layer 143. In some embodiments, the dielectric layer 143 has a first portion P1 between the conductive plugs 125a and 127a, and a second portion P2 between the conductive plugs 125b and 127b. In other words, the first portion P1 of the dielectric layer 143 is in the pattern-dense region "A" of the semiconductor substrate 101, and the second portion P2 of the dielectric layer 143 is over the pattern-loose region "B" of the semiconductor substrate 101. In particular, the first portion P1 of the dielectric layer 143 is between and in direct contact with the spacers 135a and 137a, and the second portion P2 of the dielectric layer 143 is between and in direct contact with the spacers 135b and 137b. In some embodiments, the contact area between the first portion P1 of the dielectric layer 143 and the spacer 135a (or the spacer 137a) is less than the contact area between the second portion P2 of the dielectric layer 143 and the spacer 135b (or the spacer 137b).

It should be noted that the first portion P1 of the dielectric layer 143 is separated from the semiconductor substrate 101 by an air gap G while the second portion P2 of the dielectric layer 143 is in direct contact with the semiconductor substrate 101. In other words, there is no air gap in the pattern-loose region "B". As shown in FIG. 2, the second portion P2 of the dielectric layer 143 extends to cover the bottommost parts of the spacers 135b and 137b, such that the spacer 135b is enclosed by the conductive plug 125b, the second portion P2 of the dielectric layer 143, and the semiconductor substrate 101, and the spacer 137b is enclosed by the conductive plug 127b, the second portion P2 of the dielectric layer 143, and the semiconductor substrate 101. In some embodiments, the air gap G is between the spacers 135a and 137a of the pattern-dense region "A", and a top surface TS of the conductive plug 125a is higher than a bottom surface BS of the first portion P1 of the dielectric layer 143 (i.e., the interface between the first portion P1 of the dielectric layer 143 and the air gap (G).

In some embodiments, the first portion P1 of the dielectric layer 143 has a width W1, the second portion P2 of the dielectric layer 143 has a width W2, and the width W2 is greater than the width W1. Moreover, the first portion P1 of the dielectric layer 143 has a height H1, the second portion P2 of the dielectric layer 143 has a height H2, and the height H2 is greater than the height H1. It should be noted that the height H2 of the second portion P2 of the dielectric layer 143 is substantially the same as the height of the conductive plug 125b or the height of the conductive plug 127b. Throughout the present disclosure, the term "substantially" means a degree of completeness of an action or process preferably 10%, more preferably 5%, even more preferably 2%, and most preferably 1%, or means a difference between two or more measured quantities within a tolerance of preferably 10%, more preferably 5%, even more preferably 2%, and most preferably 1%.

Furthermore, bit lines (not shown) and storage nodes (not shown) may be formed over the structure of FIGS. 1 and 2 in the subsequent processes. In some embodiments, the bit lines and the storage nodes are electrically connected to the S/D regions in the semiconductor substrate 101. In some embodiments, the semiconductor structure 100 is a dynamic random access memory (DRAM).

Figure 3:
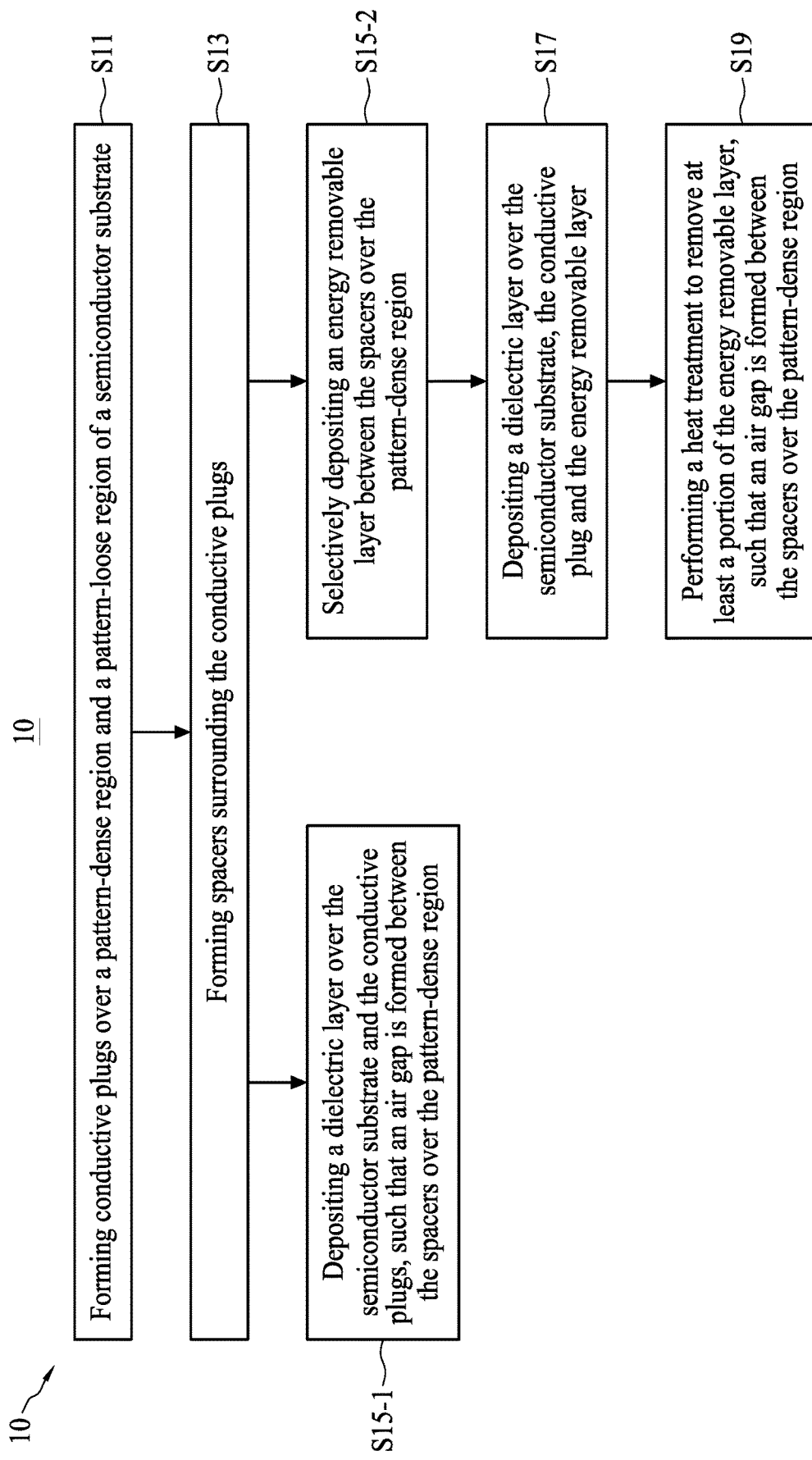
FIG. 3 is a flow diagram illustrating a method of forming a semiconductor structure, in accordance with some embodiments.
Figure 4:
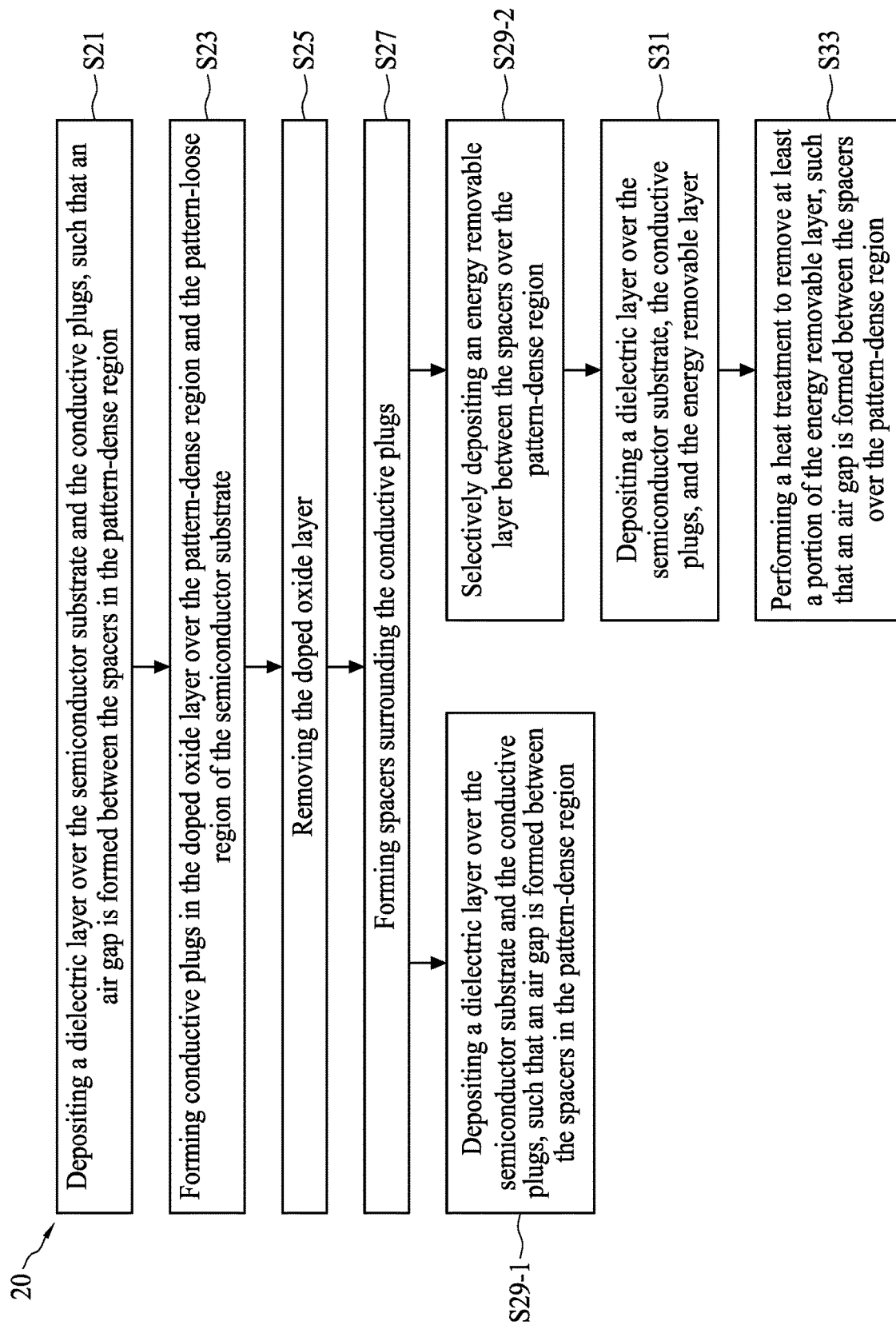
FIG. 4 is a flow diagram illustrating a method of forming a semiconductor structure, in accordance with some other embodiments.

FIG. 3 is a flow diagram illustrating a method 10 of forming the semiconductor structure 100, and the method 10 includes steps S11, S13, S15-1, S15-2, S15-3, S17, and S19, in accordance with some embodiments. FIG. 4 is a flow diagram illustrating another method 20 of forming the semiconductor structure 100, and the method 20 includes steps S21, S23, S25, S27, S29-1, S29-2, S29-3, S31, and S33, in accordance with some embodiments. The steps S11 to S19 of FIG. 3 and the steps S21 to S33 of FIG. 4 are elaborated in connection with following figures.

Figure 5:
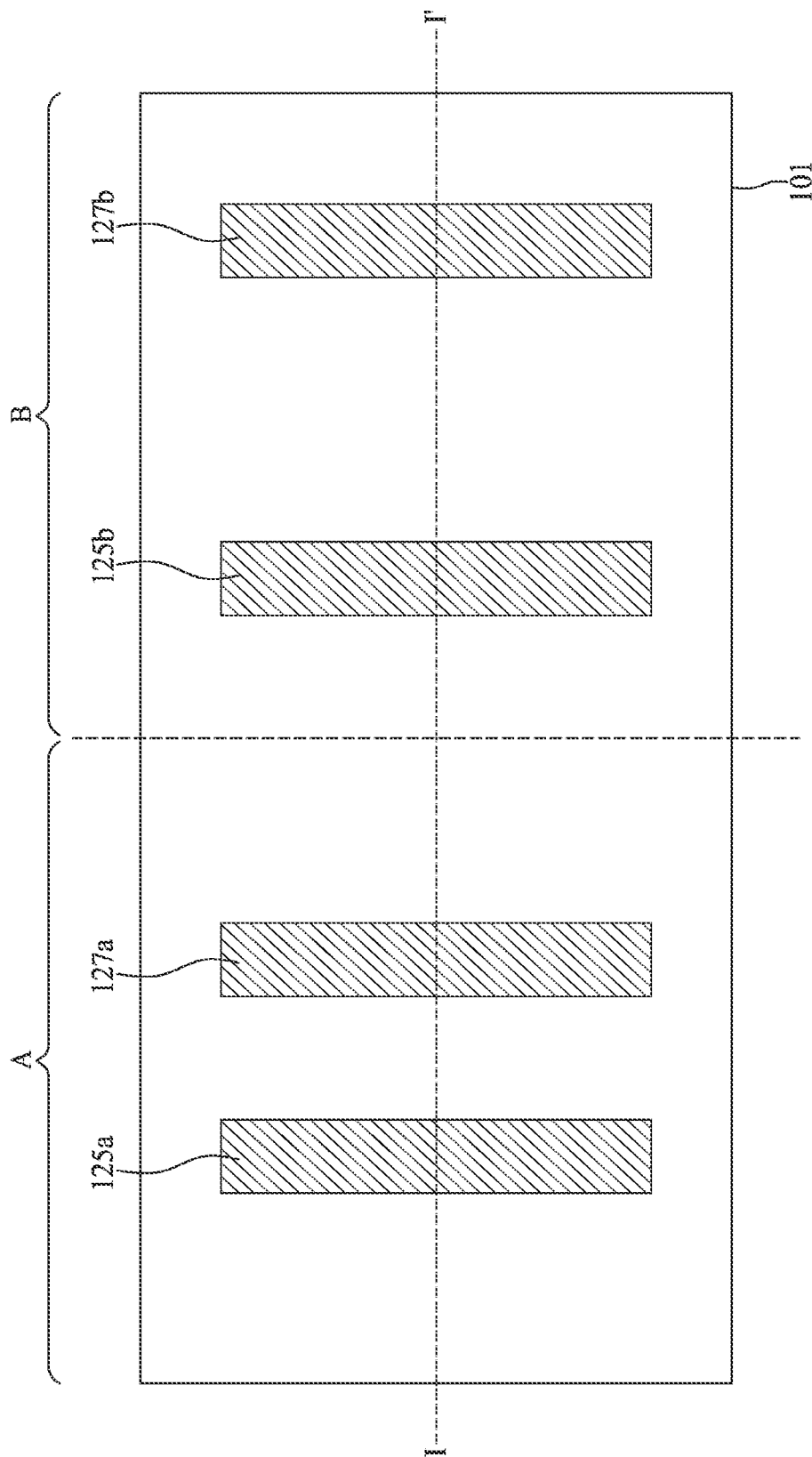
FIG. 5 is a top view illustrating an intermediate stage of forming conductive plugs during the formation of the semiconductor structure, in accordance with some embodiments.
Figure 6:
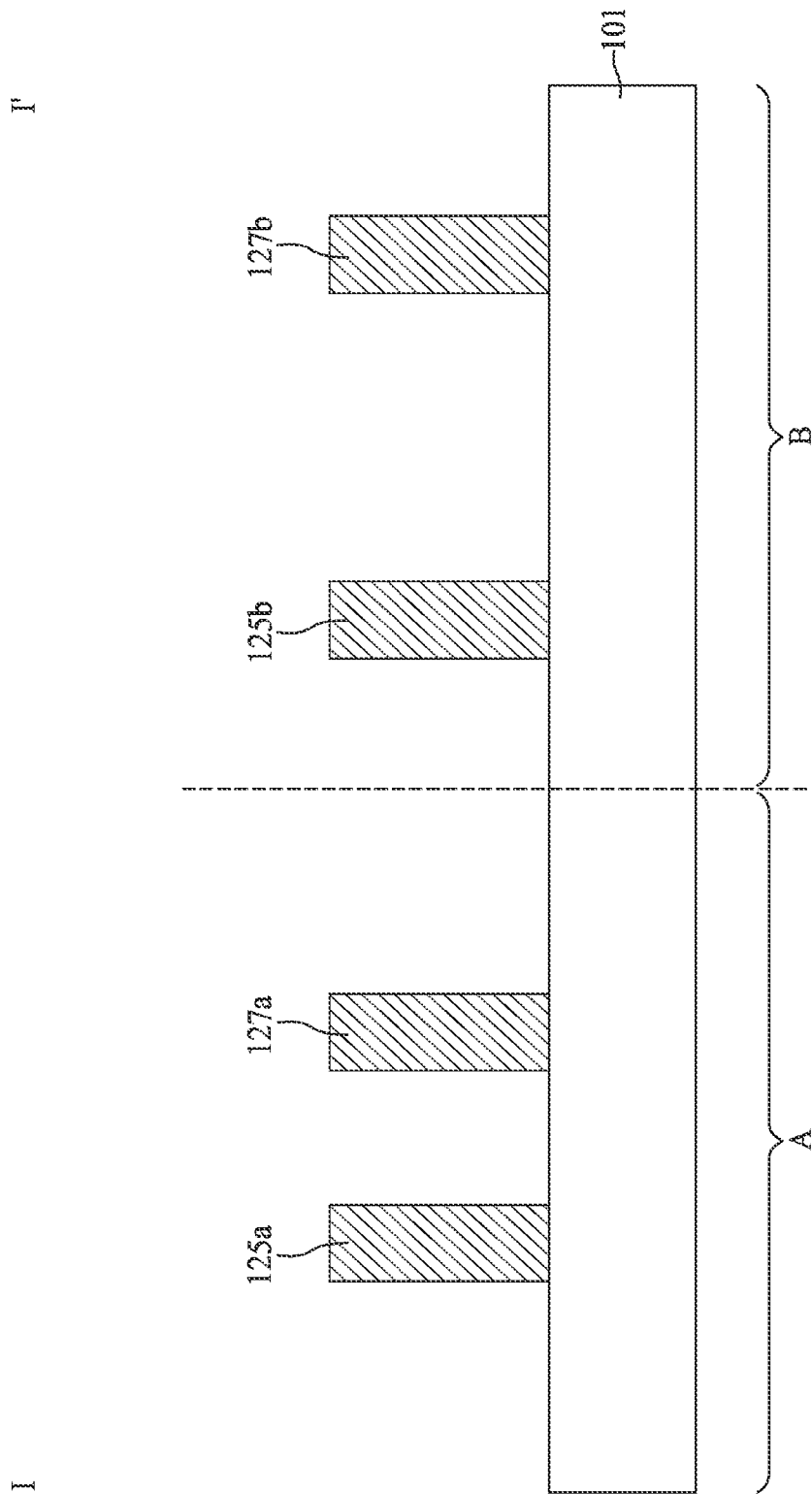
FIG. 6 is a cross-sectional view illustrating an intermediate stage of forming conductive plugs during the formation of the semiconductor structure along the sectional line I-I' in FIG. 5, in accordance with some embodiments.
Figure 7:
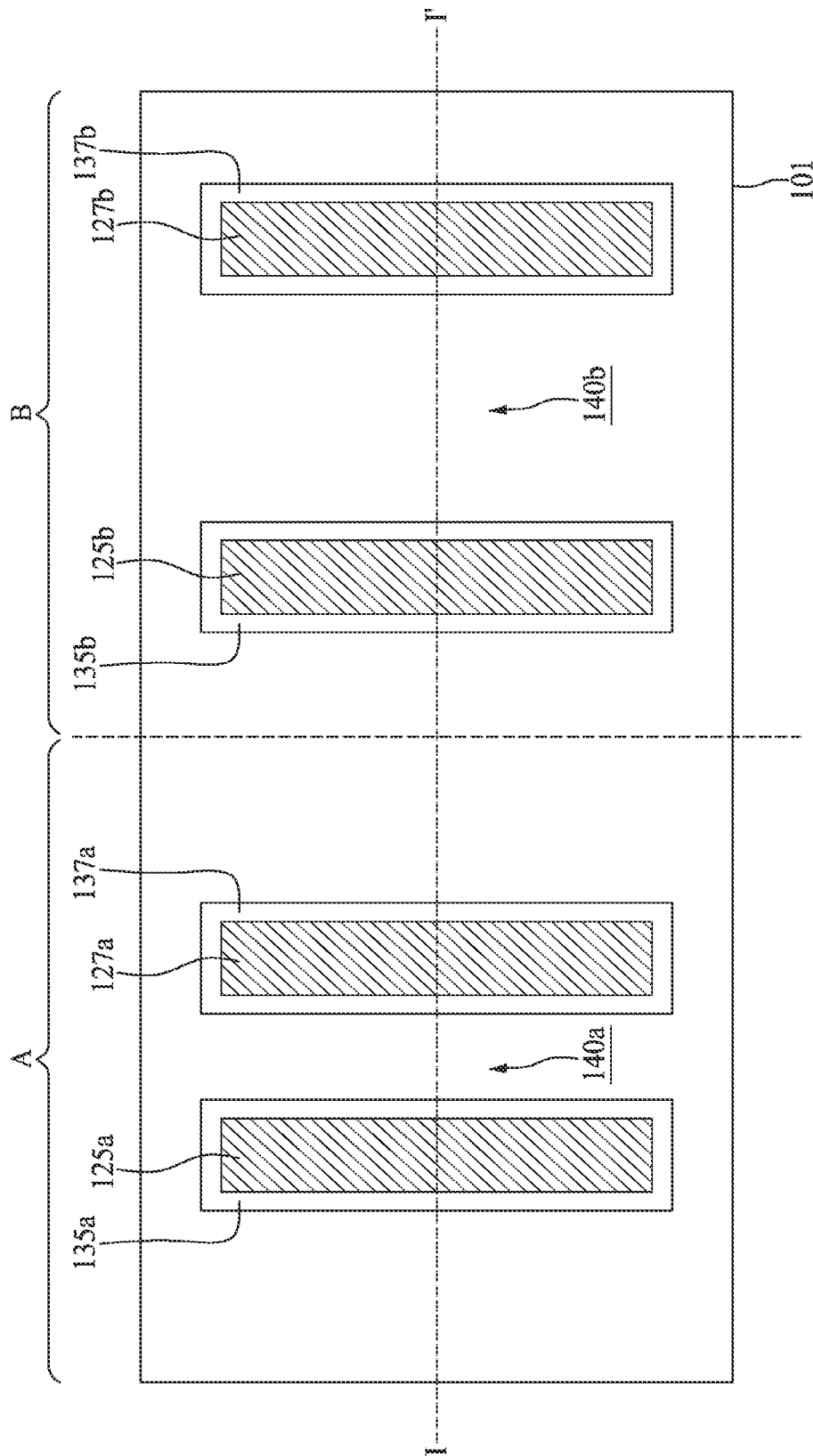
FIG. 7 is a top view illustrating an intermediate stage of forming spacers during the formation of the semiconductor structure, in accordance with some embodiments.
Figure 8:
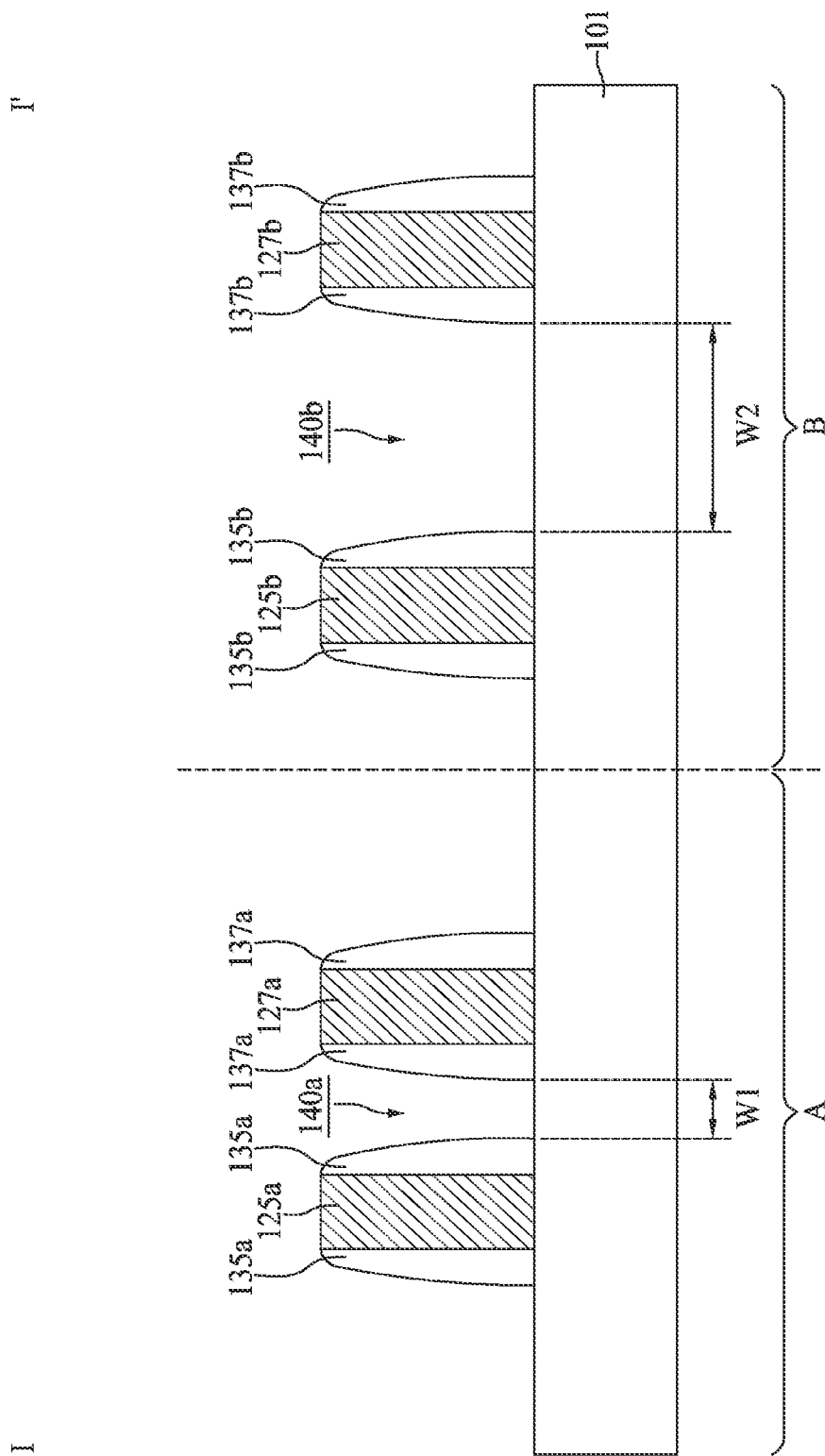
FIG. 8 is a cross-sectional view illustrating an intermediate stage of forming spacers during the formation of the semiconductor structure along the sectional line I-I' in FIG. 7, in accordance with some embodiments.

FIGS. 5 and 7 are top views illustrating intermediate stages in the formation of the semiconductor structure 100, and FIGS. 6 and 8 are cross-sectional views illustrating intermediate stages in the formation of the semiconductor structure 100, in accordance with some embodiments. It should be noted that FIGS. 6 and 8 are cross-sectional views along the sectional line I-I' of FIGS. 5 and 7, respectively.

As shown in FIGS. 5 and 6, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

As mentioned above, the semiconductor substrate 101 has a pattern-dense region "A" and a pattern-loose region "B", and isolation structures and S/D regions may be formed in the semiconductor substrate 101. In these cases, the conductive plugs 125*a*, 125*b*, 127*a*, and 127*b* are formed over the S/D regions. In some embodiments, the conductive plugs 125*a* and 127*a* are formed over the pattern-dense region "A", and the conductive plugs 125*b* and 127*b* are formed over the pattern-loose region "B". The respective step is illustrated as the step S11 in the method 10 shown in FIG. 3. It should be noted that the number of conductive plugs over the pattern-dense region "A" is not limited to two, and may be more than two. Similarly, the number of conductive plugs over the pattern-loose region "B" is not limited to two, and may be more than two, either.

In some embodiments, the conductive plugs 125*a*, 125*b*, 127*a*, and 127*b* comprise copper (Cu), copper alloy, aluminum (Al), aluminum alloy, tungsten (W), tungsten alloy, titanium (Ti), titanium alloy, tantalum (Ta), tantalum alloy, another applicable conductive material, or a combination thereof. In some embodiments, the conductive plugs 125*a*, 125*b*, 127*a*, and 127*b* are formed by electroplating. In some other embodiments, the conductive plugs 125*a*, 125*b*, 127*a*, and 127*b* are formed by a chemical vapor deposition (CVD) process, a metal organic CVD (MOCVD) process, a physical vapor deposition (PVD) process, an atomic layer deposition (ALD) process, a sputtering process, or another applicable process.

Next, as shown in FIGS. 7 and 8, the spacers 135*a*, 135*b*, 137*a*, and 137*b* are formed surrounding the conductive plugs 125*a*, 125*b*, 127*a*, and 127*b*, in accordance with some embodiments. The respective step is illustrated as the step S13 in the method 10 shown in FIG. 3. In some embodiments, the spacers 135*a*, 135*b*, 137*a*, and 137*b* are formed on sidewalls of the conductive plugs 125*a*, 125*b*, 127*a*, and 127*b*, respectively.

In some embodiments, the spacers 135*a*, 135*b*, 137*a*, and 137*b* comprise silicon oxide, silicon carbide, silicon nitride, silicon oxynitride, another applicable dielectric material, or a combination thereof. In some embodiments, the formation of the spacers 135*a*, 135*b*, 137*a*, and 137*b* includes conformally depositing a spacer material (not shown) over the top surfaces and the sidewalls of the conductive plugs 125*a*, 125*b*, 127*a*, and 127*b* and the top surface of the semiconductor substrate 101, and etching the spacer material to form the spacers 135*a*, 135*b*, 137*a*, and 137*b* on sidewalls of the conductive plugs 125*a*, 125*b*, 127*a*, and 127*b*.

The deposition process for forming the spacers 135*a*, 135*b*, 137*a*, and 137*b* may include a CVD process, a PVD process, an ALD process, a spin-coating process, or another applicable process. In addition, the etching process for forming the spacers 135*a*, 135*b*, 137*a*, and 137*b* may be an anisotropic etching process, which removes the horizontal portions of the spacer material, leaving the spacers 135*a*, 135*b*, 137*a*, and 137*b* on the sidewalls of the conductive plugs 125*a*, 125*b*, 127*a*, and 127*b*. In some embodiments, the etching process is a dry etching process. As a result, an opening 140*a* is obtained between the spacers 135*a* and 137*a*, and another opening 140*b* is obtained between the spacers 135*b* and 137*b*.

Referring to FIG. 2, after the spacers 135*a*, 135*b*, 137*a*, and 137*b* are formed, the dielectric layer 143 is deposited over the structure of FIGS. 7 and 8, such that the air gap G is formed over the pattern-dense region "A", in accordance with some embodiments. The respective step is illustrated as the step S15-1 in the method 10 shown in FIG. 3.

In some embodiments, the dielectric layer 143 comprises a low-k dielectric material with a dielectric constant (k value) less than about 5. Examples of the low-k dielectric material include, but not limited to, silicon oxide, silicon nitride, silicon oxynitride, silicon carbide, silicon carbonitride, fluorinated silica glass (FSG), carbon doped silicon oxide, amorphous fluorinated carbon, parylene, bis-benzocyclobutenes (BCB), or polyimide. In addition, the dielectric layer 143 may be formed by a deposition process. In some embodiments, the deposition process is a CVD process, a PVD process, an ALD process, a spin-coating process, or another applicable process.

Since the width W2 of the opening 140b is greater than the width W1 of the opening 140a (see FIG. 8), the opening 140b is entirely filled by the dielectric layer 143 while the opening 140a is only partially filled by the dielectric layer 143 due to the loading effect. As a result, the air gap G is sealed by the first portion P1 of the dielectric layer 143. In some embodiments, the air gap G is enclosed by the first portion P1 of the dielectric layer 143, the spacers 135a, 137a, and the semiconductor substrate 101. In addition, the width W2 is also the width of the second portion P2 of the dielectric layer 143 between the spacers 135b and 137b, and the width W1 is also the width W1 of the first portion P1 of the dielectric layer 143 between the spacers 135a and 137a, as shown in FIG. 2 in accordance with some embodiments.

After the dielectric layer 143 is deposited, the semiconductor structure 100 is obtained. By forming the air gap G between the conductive plugs 125a and 127a (or between the spacers 135a and 137a surrounding the conductive plugs 125a and 127a), the parasitic capacitance between the conductive plugs 125a and 127a may be reduced, especially over the pattern-dense region "A". As a result, the overall device performance may be improved (e.g., the decreased power consumption and signal delay).

FIGS. 9 to 15 are cross-sectional views illustrating intermediate stages in the formation of the semiconductor structure 100, in accordance with some embodiments. The forming method shown in FIGS. 9-15 is different from the forming method shown in FIGS. 1, 2, and 5 to 8.

Figure 9:
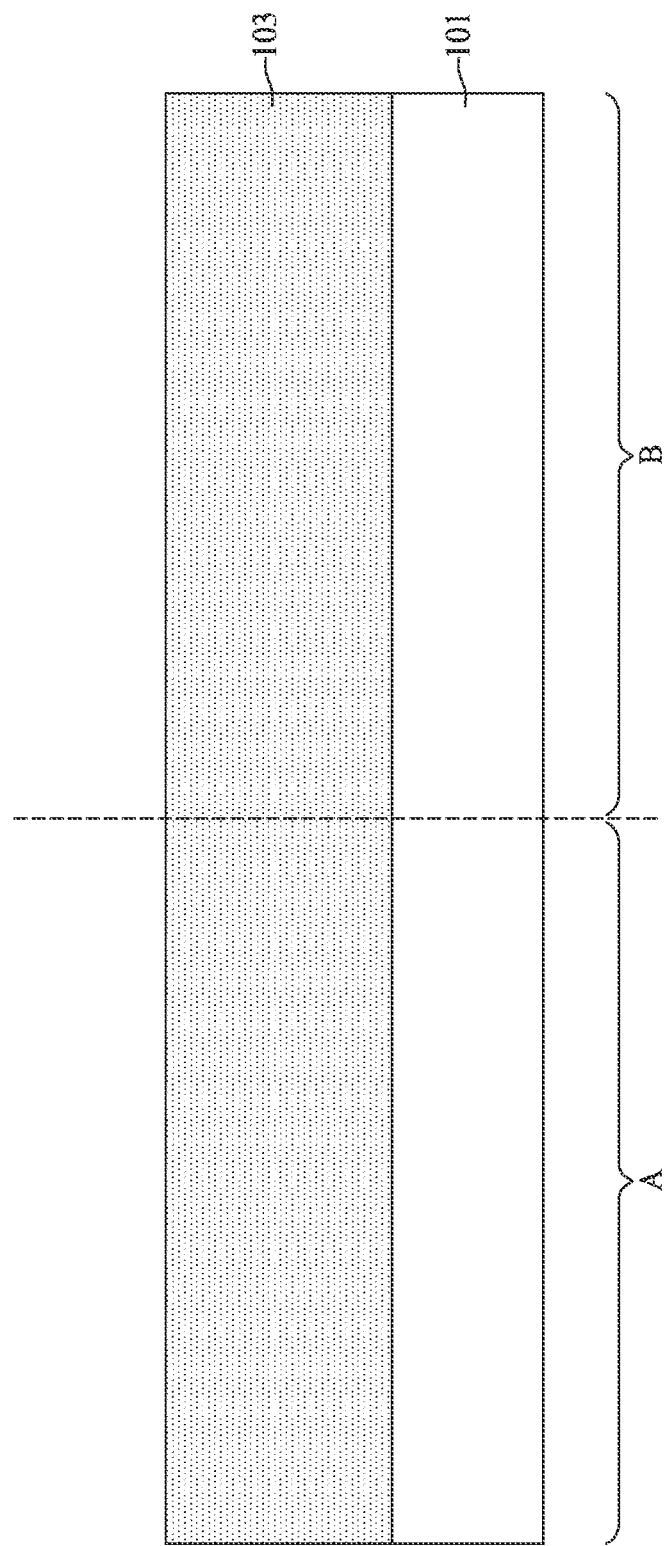
FIG. 9 is a cross-sectional view illustrating an intermediate stage of forming a doped oxide layer during the formation of the semiconductor structure, in accordance with some other embodiments.

A doped oxide layer 103 is formed over the pattern-dense region "A" and the pattern-loose region "B" of the semiconductor substrate 101, as shown in FIG. 9 in accordance with some embodiments. The respective step is illustrated as the step S21 in the method 20 shown in FIG. 4. In some embodiments, the doped oxide layer 103 comprises silicon oxide, and P-type dopants, such as boron (B), gallium (Ga), or indium (In), or N-type dopants, such as phosphorous (P) or arsenic (As), can be implanted therein. In some embodiments, the doped oxide layer 103 is formed by a deposition process and is doped in-situ during the deposition process. In some embodiments, the doped oxide layer 103 is replaced with other suitable dielectric layers. In some other embodiments, the doped oxide layer 103 is formed by a deposition process and a subsequent ion implantation process.

Figure 10:
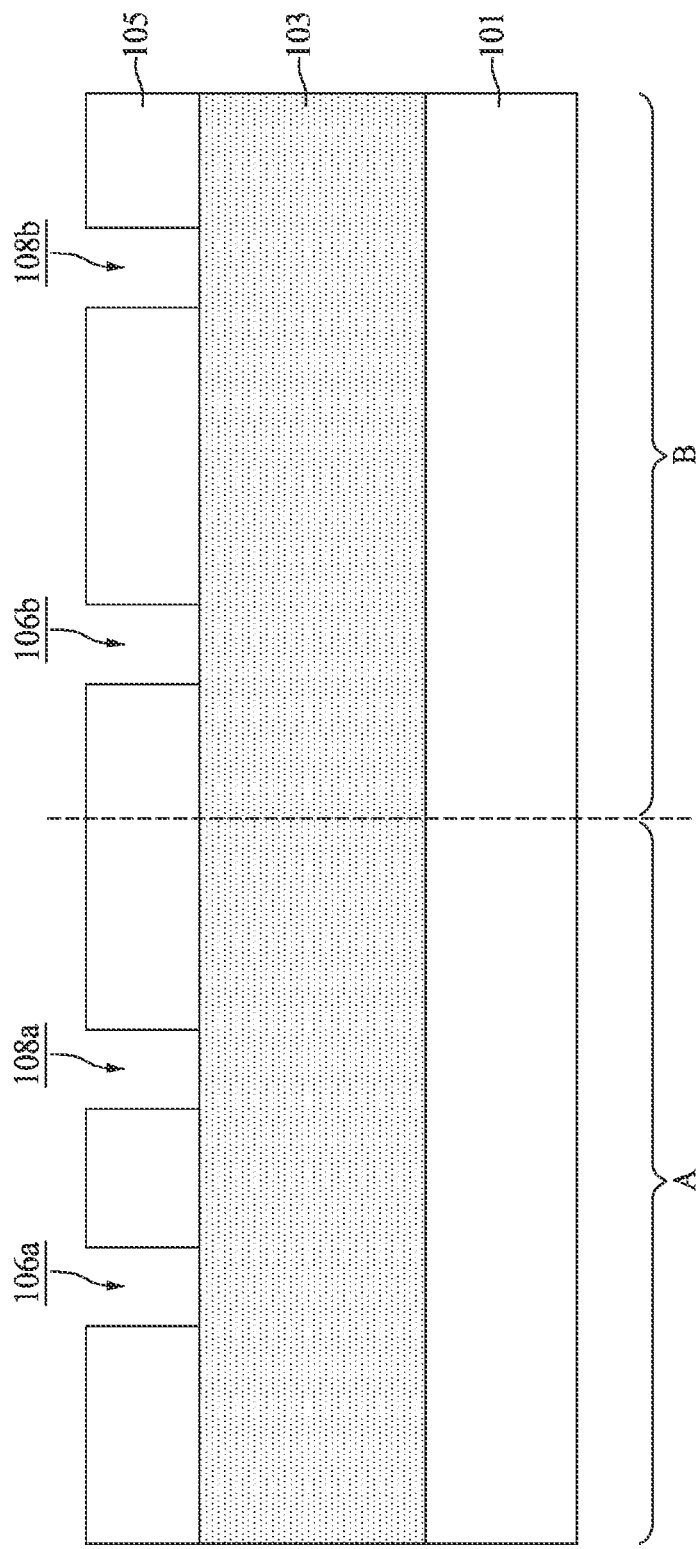
FIG. 10 is a cross-sectional view illustrating an intermediate stage of forming a patterned mask during the formation of the semiconductor structure, in accordance with some embodiments.

Next, a patterned mask 105 is formed over the doped oxide layer 103, as shown in FIG. 10 in accordance with some embodiments. In some embodiments, the patterned mask 105 has openings 106a, 106b, 108a, and 108b, and portions of the doped oxide layer 103 are exposed by the openings 106a, 106b, 108a, and 108b of the patterned mask 105.

The patterned mask 105 may be formed by a deposition process and a patterning process. The deposition process for forming the patterned mask 105 may be a CVD process, a high-density plasma CVD (HDPCVD) process, a spin-coating process, or another applicable process. The patterning process for forming the patterned mask 105 may include a photolithography process and an etching process. The photolithography process may include photoresist coating (e.g., spin-coating), soft baking, mask aligning, exposure, post-exposure baking, developing the photoresist, rinsing and drying (e.g., hard baking). The etching process may include a dry etching process or a wet etching process.

Figure 11:
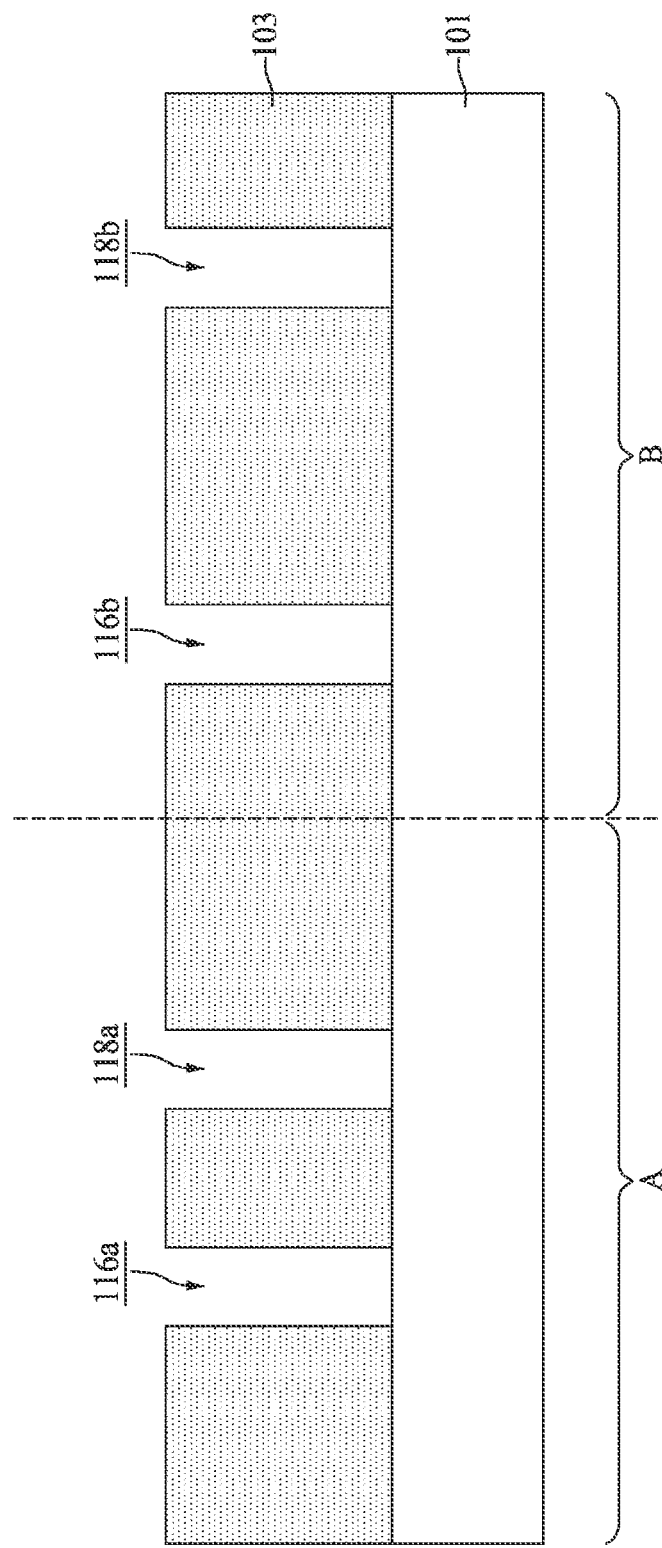
FIG. 11 is a cross-sectional view illustrating an intermediate stage of forming openings in the doped oxide layer during the formation of the semiconductor structure, in accordance with some embodiments.

Subsequently, an etching process is performed on the doped oxide layer 103 using the patterned mask 105 as a mask, as shown in FIG. 11 in accordance with some embodiments. After the etching process, openings 116a, 116b, 118a, and 118b are formed in the doped oxide layer 103. In some embodiments, portions of the semiconductor substrate 101 are exposed through the openings 116a, 116b, 118a, and 118b of the doped oxide layer 103. In particular, the openings 116a and 118a are located on the pattern-dense region "A" of the semiconductor substrate 101, and the openings 116b and 118b are located on the pattern-loose region "B" of the semiconductor substrate 101, in accordance with some embodiments. After the openings 116a, 116b, 118a, and 118b are formed, the patterned mask 105 may be removed.

Figure 12:
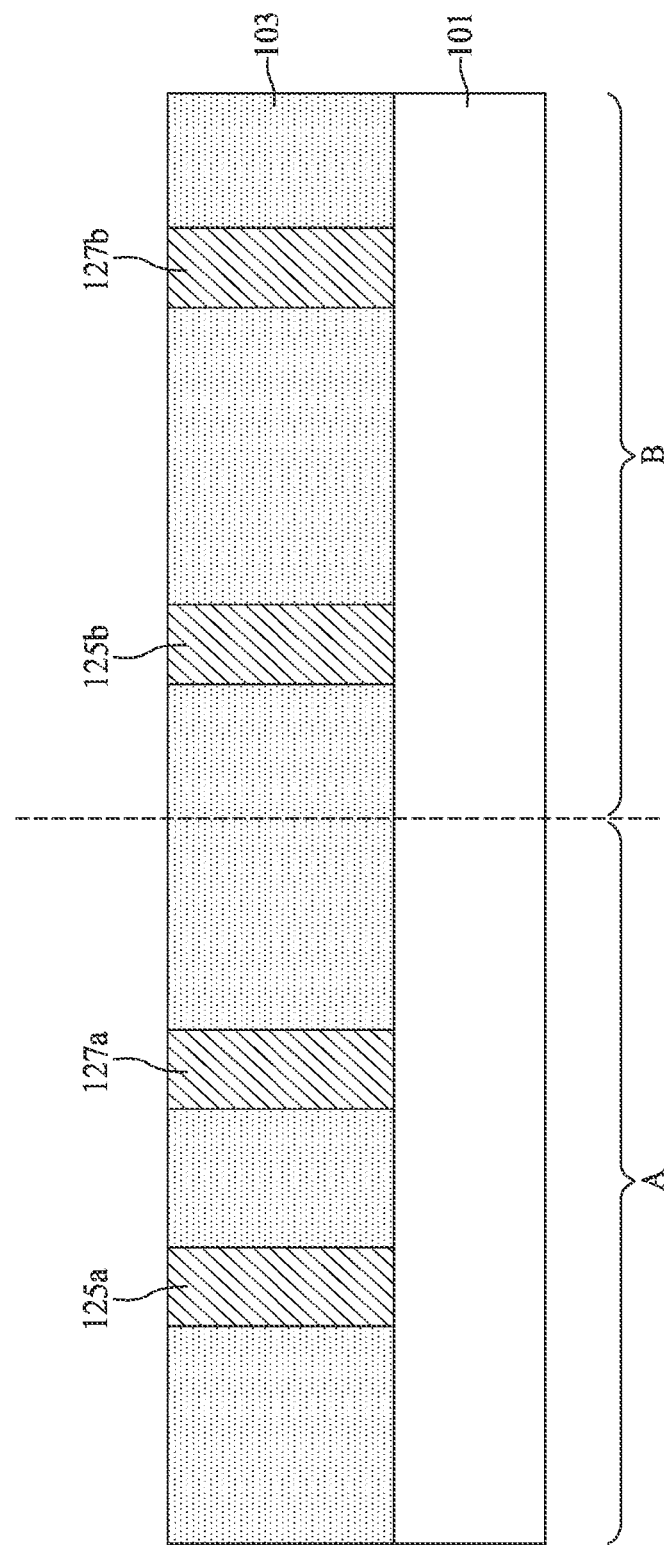
FIG. 12 is a cross-sectional view illustrating an intermediate stage of forming conductive plugs in the doped oxide layer during the formation of the semiconductor structure, in accordance with some embodiments.

Then, conductive plugs 125a, 125b, 127a, and 127b are formed in the openings 116a, 116b, 118a, and 118b, as shown in FIG. 12 in accordance with some embodiments. The respective step is illustrated as the step S23 in the method 20 shown in FIG. 4. In some embodiments, the conductive plugs 125a and 127a are formed over the pattern-dense region "A" of the semiconductor substrate 101, and the conductive plugs 125b and 127b are formed over the pattern-loose region "B" of the semiconductor substrate 101.

Some materials used to form the conductive plugs 125a, 125b, 127a, and 127b of FIG. 12 are similar to, or the same as, those used to form the conductive plugs 125a, 125b, 127a, and 127b of FIG. 6, and details thereof are not repeated herein. In addition, the formation of the conductive plugs 125a, 125b, 127a, and 127b of FIG. 12 may include depositing a conductive material (not shown) in the openings 116a, 116b, 118a, and 118b and over the doped oxide layer 103, and performing a planarization process to remove the excess portions of the conductive material, such that the doped oxide layer 103 is exposed. In some embodiments, the patterned mask 105 (see FIG. 10) is not removed after the openings 116a, 116b, 118a, and 118b are formed, and the conductive layer is deposited in the openings 116a, 116b, 118a, and 118b and over the patterned mask 105. In these cases, the patterned mask 105 may be removed during the planarization process. The planarization process may be a chemical mechanical polishing (CMP) process.

Figure 13:
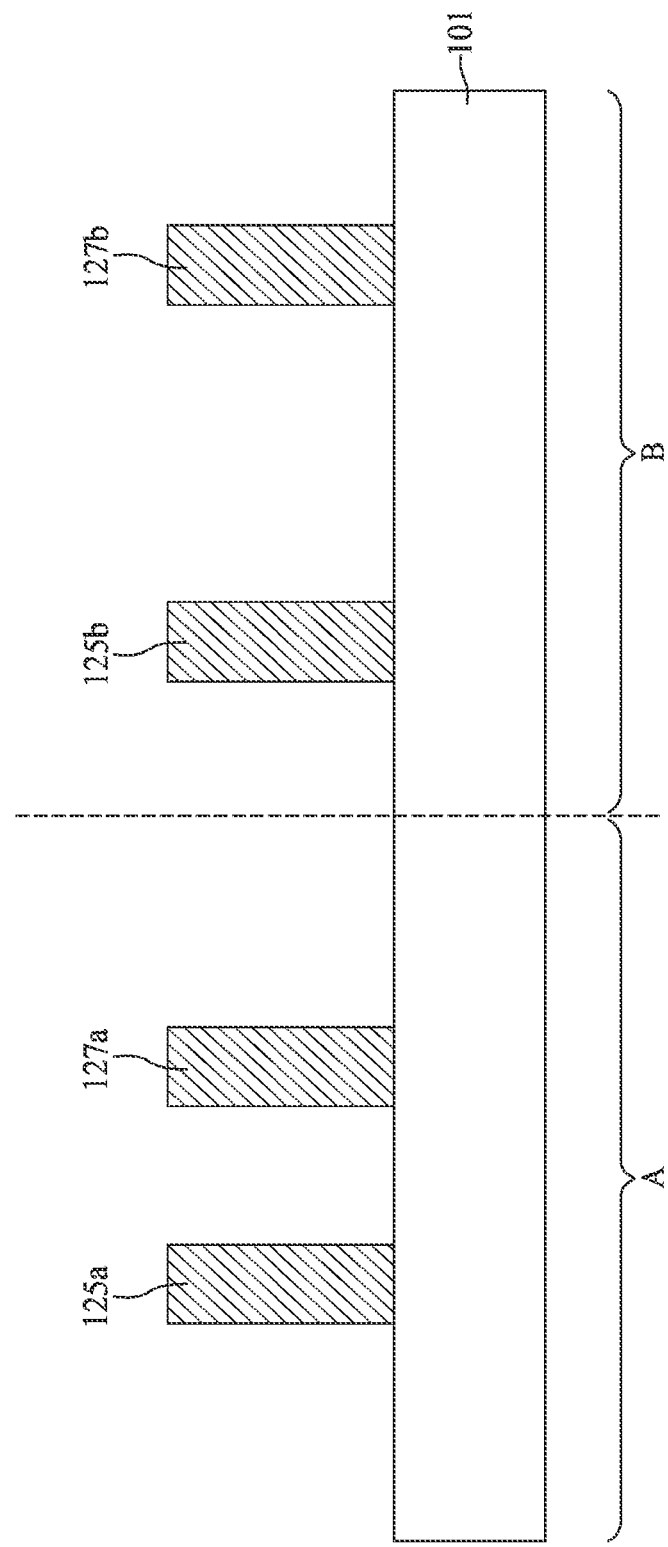
FIG. 13 is a cross-sectional view illustrating an intermediate stage of removing the doped oxide layer during the formation of the semiconductor structure, in accordance with some embodiments.

After the conductive plugs 125a, 125b, 127a, and 127b are formed, the doped oxide layer 103 is removed, as shown in FIG. 13 in accordance with some embodiments. The respective step is illustrated as the step S25 in the method 20 shown in FIG. 4. In some embodiments, the doped oxide layer 103 is removed by an ashing process or stripping process. In some other embodiments, an etching process is used to remove the doped oxide layer 103. The etching process may include a wet etching process, a dry etching process, or a combination thereof.

Figure 14:
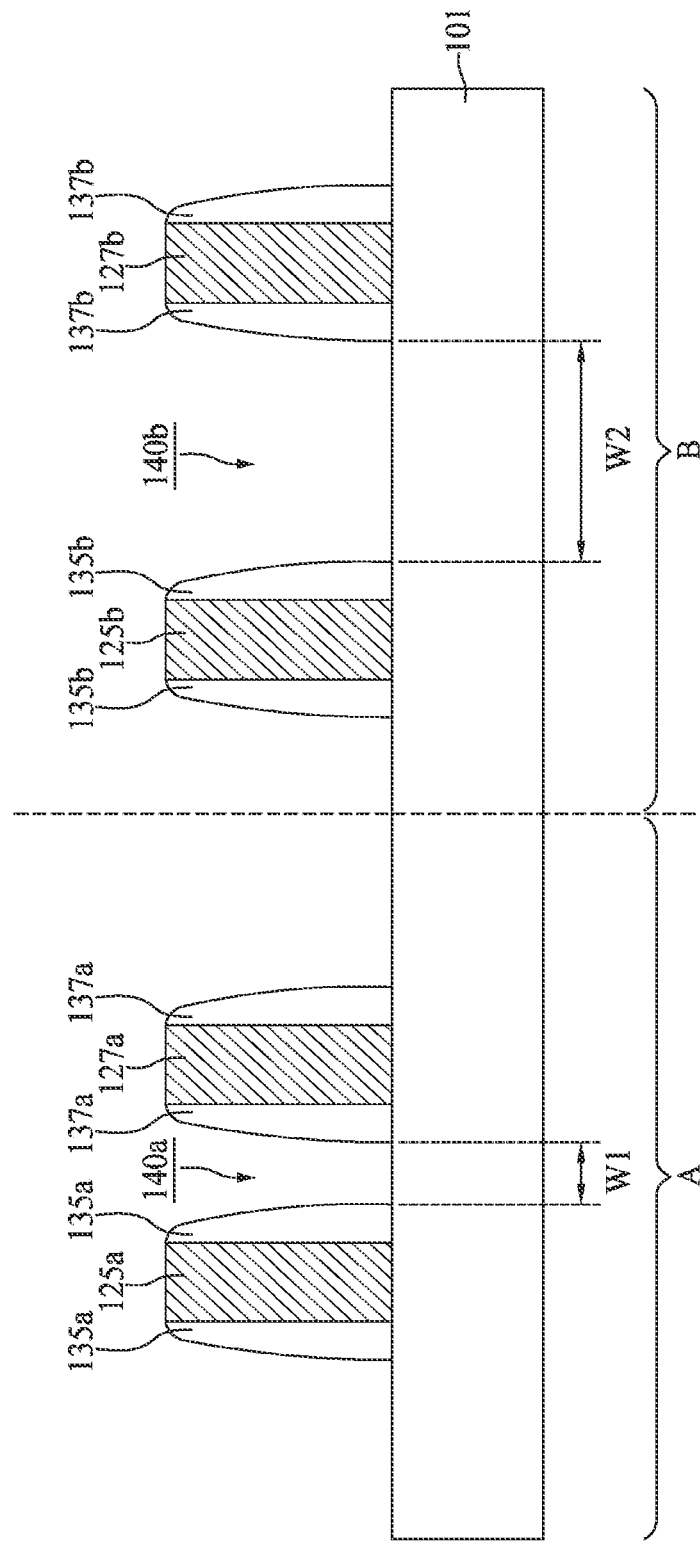
FIG. 14 is a cross-sectional view illustrating an intermediate stage of forming spacers during the formation of the semiconductor structure, in accordance with some embodiments.

Next, as shown in FIG. 14, the spacers 135a, 135b, 137a, and 137b are formed surrounding the conductive plugs 125a, 125b, 127a, and 127b, in accordance with some embodiments. The respective step is illustrated as the step S27 in the method 20 shown in FIG. 4. Some materials and processes used to form the spacers 135a, 135b, 137a, and 137b of FIG. 14 are similar to, or the same as, those used to form the spacers 135a, 135b, 137a, and 137b of FIG. 8, and details thereof are not repeated herein.

After the spacers 135a, 135b, 137a, and 137b are formed, opening 140a between the spacers 135a and 137a and opening 140b between the spacers 135b and 137b are obtained. It should be noted that the width W1 of the opening 140a in the pattern-dense region "A" is less than the width W2 of the opening 140b in the pattern-loose region "B", in accordance with some embodiments.

Figure 15:
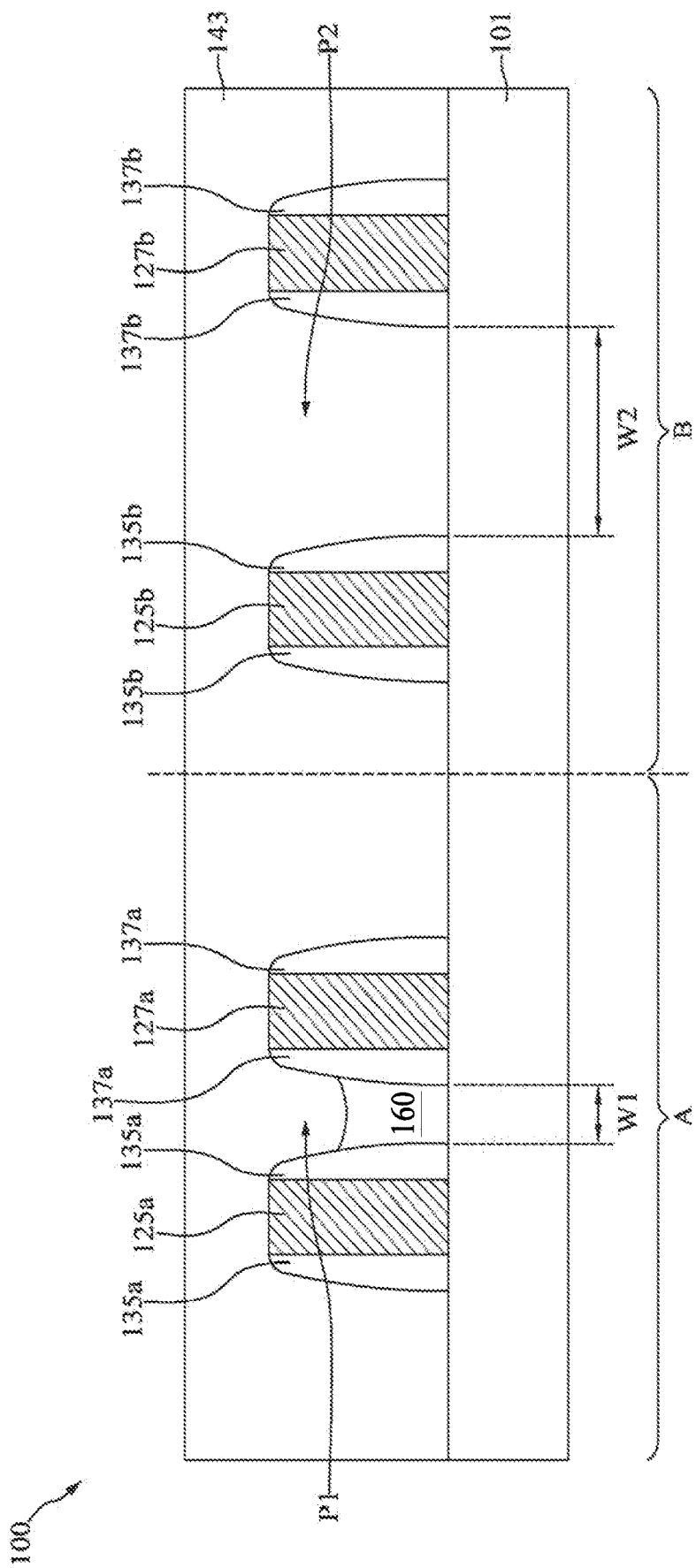
FIG. 15 is a cross-sectional view illustrating an intermediate stage of forming a dielectric layer during the formation of the semiconductor structure, in accordance with some embodiments.

After the spacers 135a, 135b, 137a, and 137b are formed, the dielectric layer 143 is deposited over the structure of FIG. 14, such that the air gap G is formed in the opening 140a over the pattern-dense region "A", as shown in FIG. 15 in accordance with some embodiments. The respective step is illustrated as the step S29-1 in the method 20 shown in FIG. 4. Some materials and processes used to form the dielectric layer 143 of FIG. 15 are similar to, or the same as, those used to form the dielectric layer 143 of FIG. 2, and details thereof are not repeated herein.

As mentioned above, the width W2 of the opening 140b is greater than the width W1 of the opening 140a (see FIG. 14). Therefore, the opening 140b is entirely filled by the dielectric layer 143 while the opening 140a is only partially filled by the dielectric layer 143 due to the loading effect. As a result, the air gap G is sealed by the first portion P1 of the dielectric layer 143, and the second portion P2 of the dielectric layer 143 is in direct contact with the semiconductor substrate 101.

Figure 16:
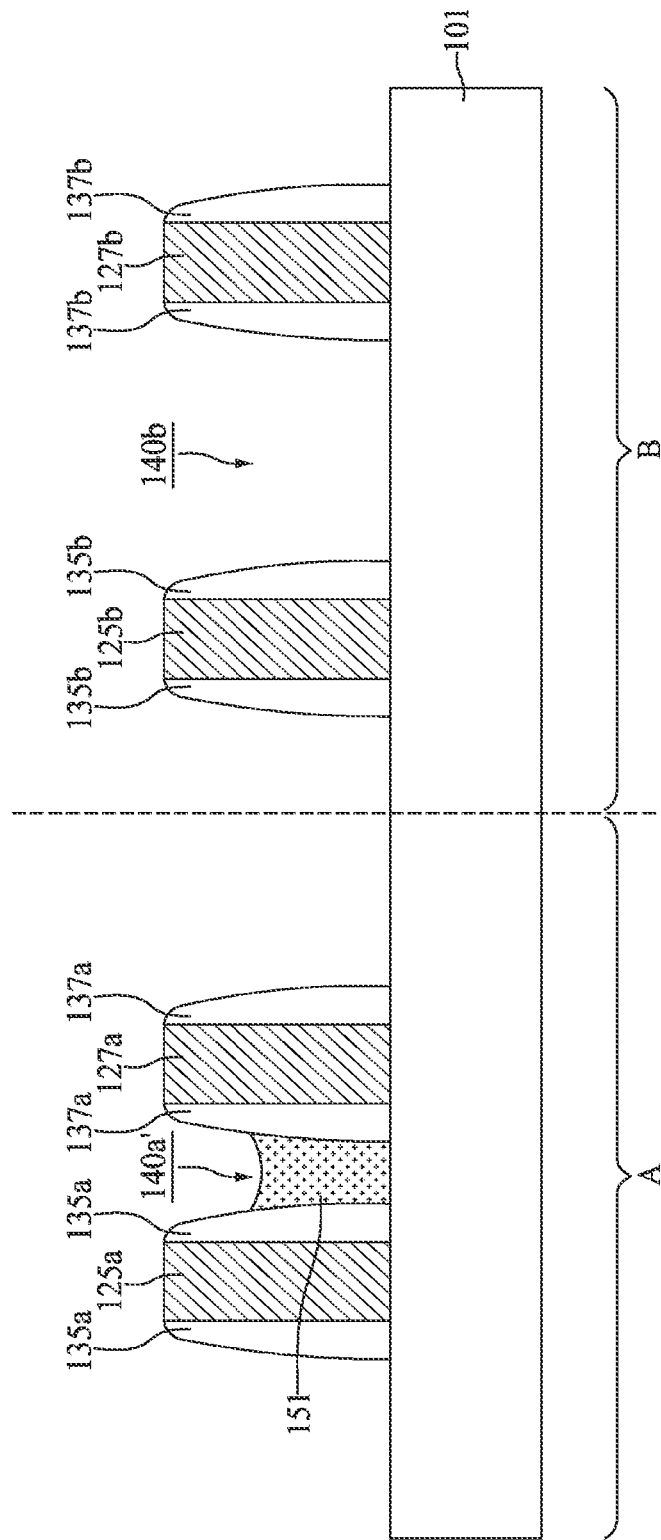
FIG. 16 is a cross-sectional view illustrating an intermediate stage of forming an energy removable layer during the formation of the semiconductor structure, in accordance with some embodiments.
Figure 17:
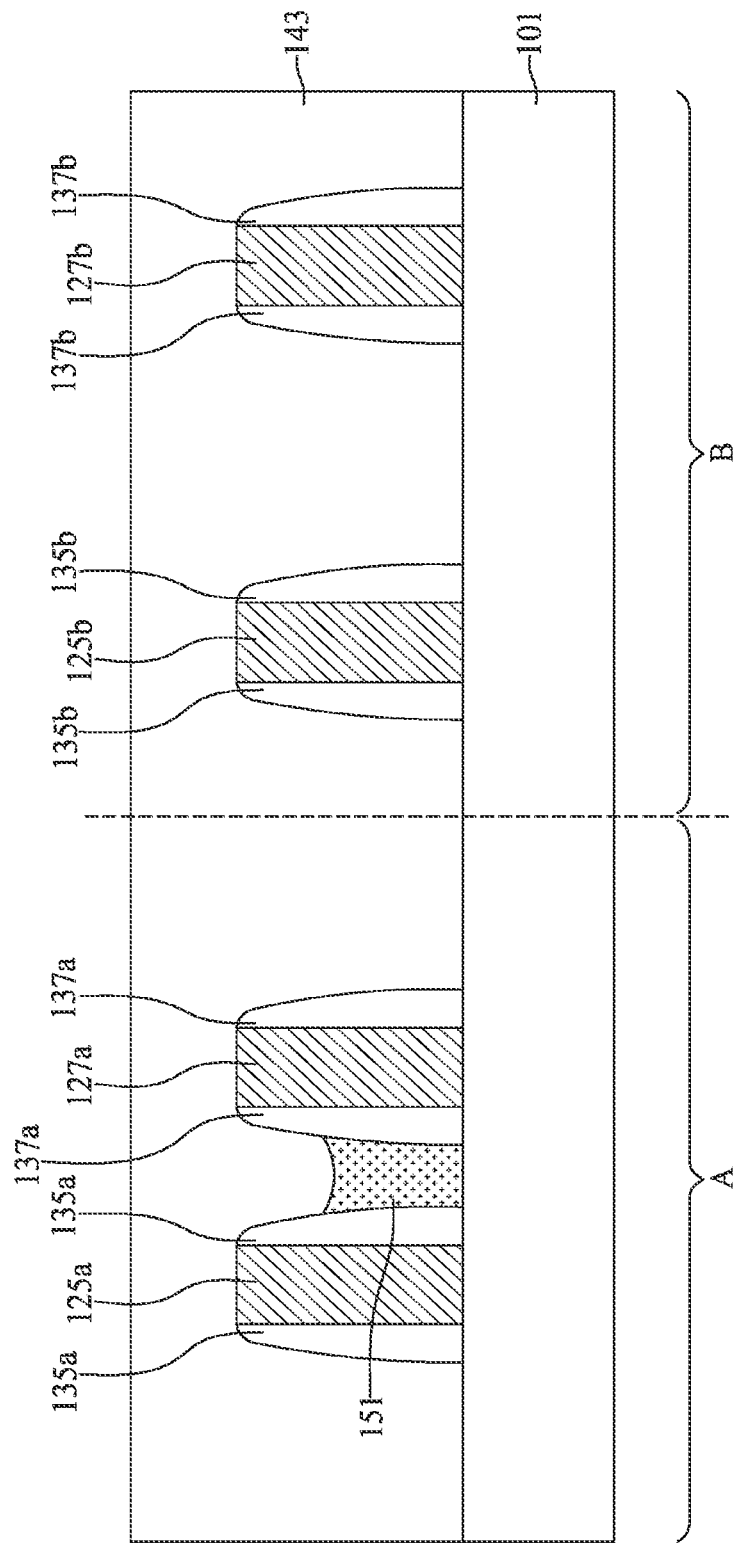
FIG. 17 is a cross-sectional view illustrating an intermediate stage of forming a dielectric layer during the formation of the semiconductor structure, in accordance with some embodiments.
Figure 18:
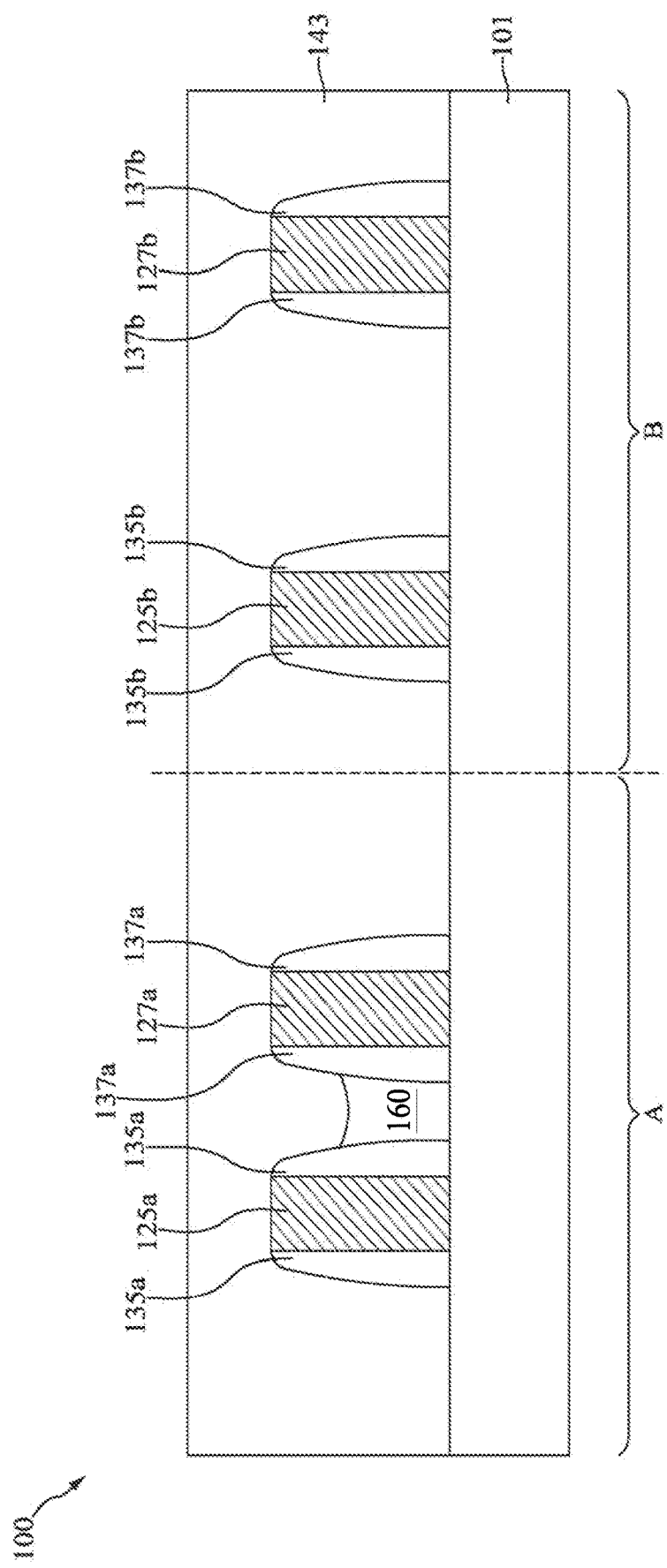
FIG. 18 is a cross-sectional view illustrating an intermediate stage of removing the energy removable layer during the formation of the semiconductor structure, in accordance with some embodiments.

FIGS. 16 to 18 are cross-sectional views illustrating intermediate stages in the formation of the semiconductor structure 100, in accordance with some embodiments. The forming method shown in FIGS. 16 to 18 is different from the forming method shown in FIGS. 1, 2, and 5 to 8 and the forming method shown in FIGS. 9 to 15.

Continuing with FIG. 8 or 14, after the spacers 135a, 135b, 137a, and 137b are formed, an energy removable layer 151 is selectively deposited between the spacers 135a and 137a over the pattern-dense region "A", as shown in FIG. 16 in accordance with some embodiments. The respective step is illustrated as the step S15-2 in the method 10 shown in FIG. 3 and the step S29-2 in the method 20 shown in FIG. 4. It should be noted that the energy removable layer 151 is formed by performing a deposition process that selectively deposits the energy removable layer 151 between the spacers 135a and 137a over the pattern-dense region "A" without depositing the energy removable layer 151 between the spacers 135b and 137b in the pattern-loose region "B", in accordance with some embodiments.

In some embodiments, the materials of the energy removable layer 151 include a thermal decomposable material. In some other embodiments, the materials of the energy removable layer 151 include a photonic decomposable material, an e-beam decomposable material, or another applicable energy decomposable material. Specifically, in some embodiments, the materials of the energy removable layer 151 include a base material and a decomposable porogen material that is substantially removed once being exposed to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can clear the space originally occupied by the energy removable layer 151 in the subsequent processes. In addition, the deposition process for forming the energy removable layer 151 may include a CVD process, a PVD process, an ALD process, a spin-coating process, or another applicable process. After the energy removable layer 151 is formed, a reduced opening 140a' may be obtained over the energy removable layer 151.

Then, the dielectric layer 143 is formed covering the structure of FIG. 16, as shown in FIG. 17 in accordance with some embodiments. The respective step is illustrated as the step S17 in the method 10 shown in FIG. 3 and the step S31 in the method 20 shown in FIG. 4. Some materials and processes used to form the dielectric layer 143 of FIG. 17 are similar to, or the same as, those used to form the dielectric layer 143 of FIG. 2, and details thereof are not repeated herein. It should be noted that the structure has no air gaps in this stage.

After the dielectric layer 143 is deposited, a heat treatment is performed, as shown in FIG. 18 in accordance with some embodiments. In some embodiments, during the heat treatment, the energy removable layer 151 is removed, such that the air gap G is formed between the spacers 135a and 137a in the pattern-dense region "A". The respective step is illustrated as the step S19 in the method 10 shown in FIG. 3 and the step S33 in the method 20 shown in FIG. 4.

More specifically, the heat treatment is used to remove the decomposable porogen materials of the energy removable layer 151 to generate pores, and the pores are filled by air after the decomposable porogen materials are removed, such that the air gap G is obtained, in accordance with some embodiments. In some other embodiments, the heat treatment can be replaced by a light treatment, an e-beam treatment, a combination thereof, or another applicable energy treatment. For example, ultra-violet (UV) light or laser light may be used to remove the decomposable porogen materials of the energy removable layer 151, such that the air gap G is obtained.

Figure 19:
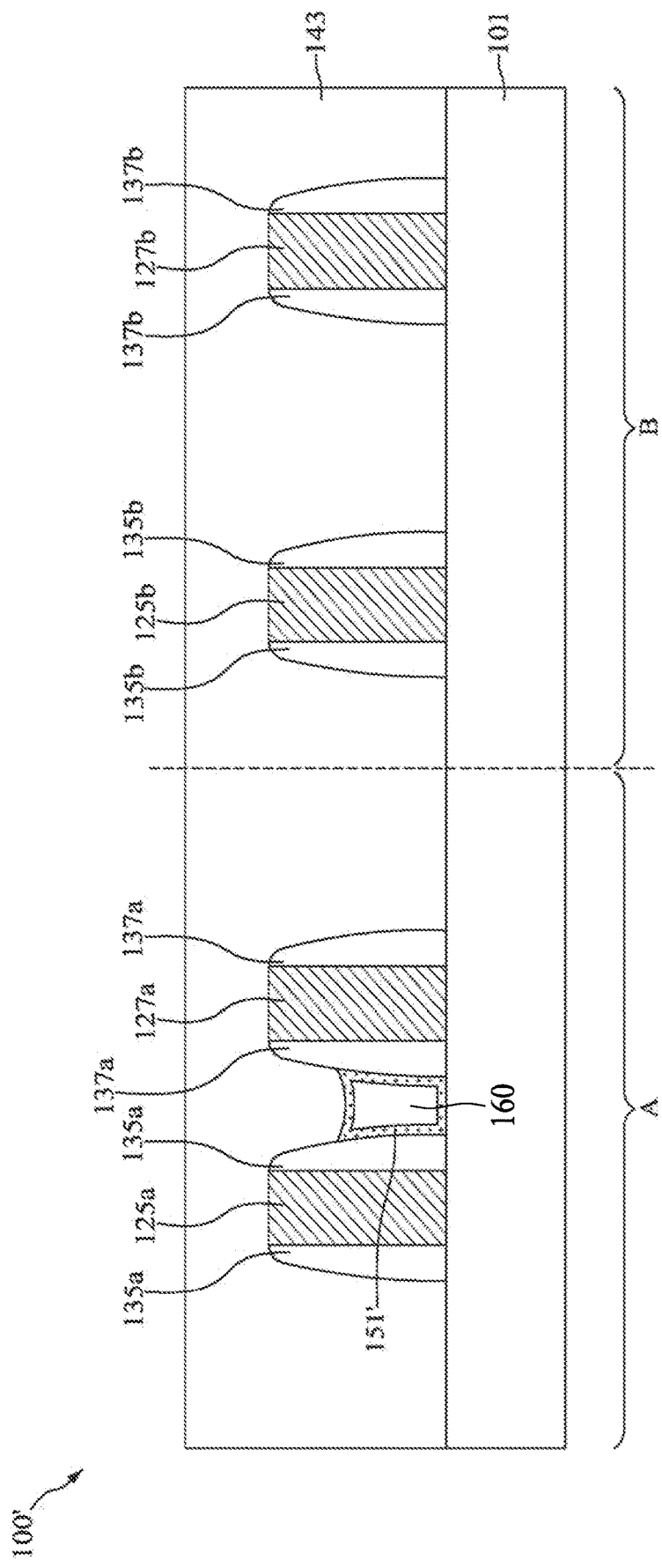
FIG. 19 is a cross-sectional view illustrating an intermediate stage of forming an energy removable structure during the formation of a modified semiconductor structure, in accordance with some embodiments.

FIG. 19 is a cross-sectional view illustrating an intermediate stage of forming an energy removable structure 151' during the formation of a modified semiconductor structure 100', in accordance with some embodiments.

Continuing with FIG. 17, a heat treatment is performed to remove a portion of the energy removable layer 151, as shown in FIG. 19 in accordance with some embodiments. In some embodiments, during the heat treatment, the energy removable layer 151 is transformed into an energy removable structure 151', such that the air gap G is enclosed by the energy removable structure 151'. The respective step is illustrated as the step S19 in the method 10 shown in FIG. 3 and the step S33 in the method 20 shown in FIG. 4.

More specifically, in some embodiments, the heat treatment is used to remove the decomposable porogen materials of the energy removable layer 151 to generate pores, and the base materials of the energy removable layer 151 are accumulated at the edges of the energy removable layer 151. The pores are filled by air after the decomposable porogen materials are removed, such that the air gap G is obtained inside the remaining portions of the energy removable layer 151 (i.e., the energy removable structure 151'), in accordance with some embodiments. In some other embodiments, the air gap G is not fully surrounded by the energy removable structure 151' due to gravity, and a portion of the energy removable structure 151' is between the air gap G and the semiconductor substrate 101. After the energy removable structure 151' is formed, the modified semiconductor structure 100' is obtained.

Figure 20:
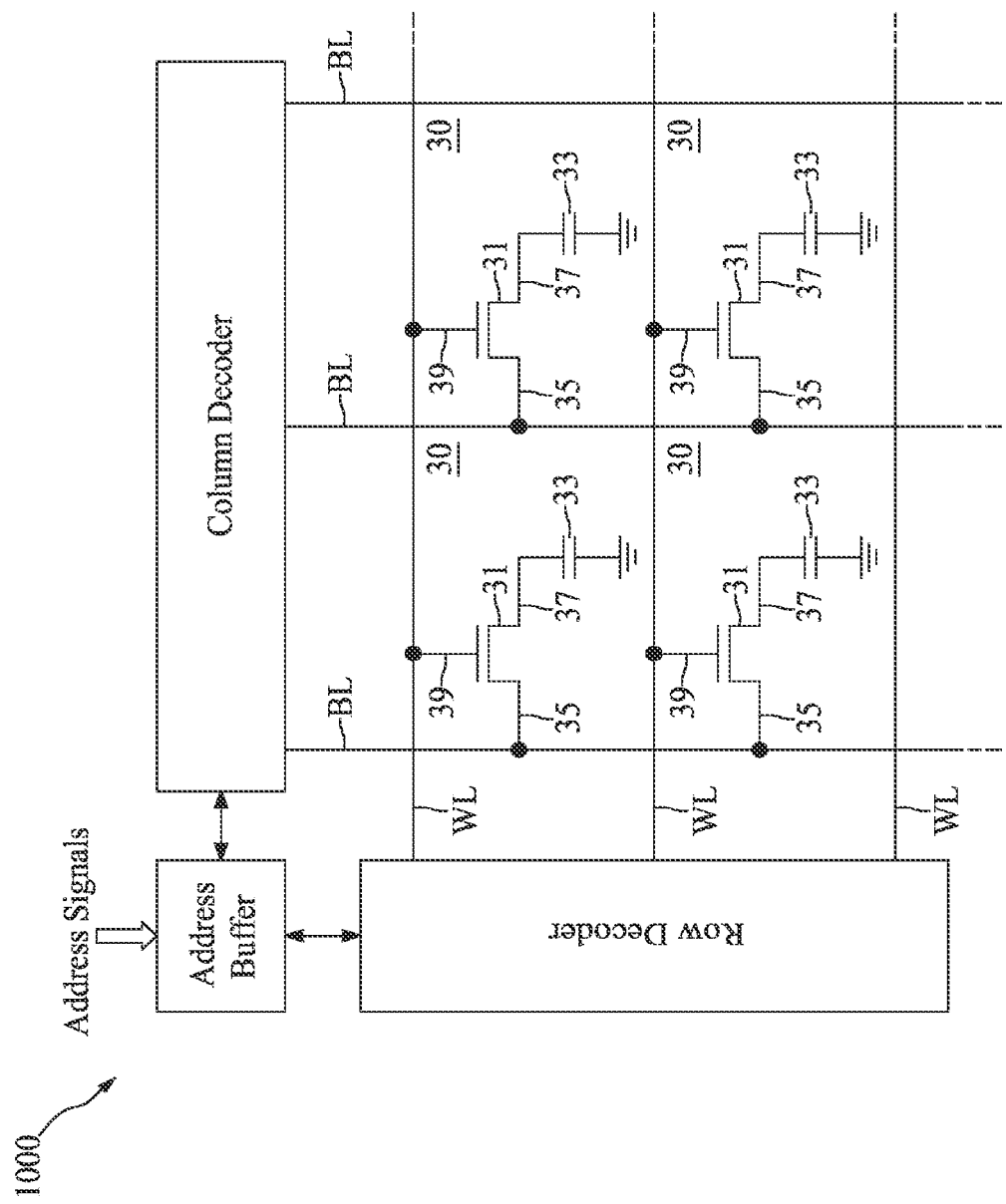
FIG. 20 is a partial schematic illustration of an exemplary integrated circuit, including an array of memory cells in accordance with some embodiments.

FIG. 20 is a partial schematic illustration of an exemplary integrated circuit, such as a memory device 1000, including an array of memory cells 30 in accordance with some embodiments. In some embodiments, the memory device 1000 includes a dynamic random access memory (DRAM). In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 31 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is determined to be stored in the memory cell 30.

The bit lines BL are configured to read and write data to and from the memory cells 30. The word lines WL are configured to activate the field effect transistors (FET) 31 to access a particular row of the memory cells 30. Accordingly, the memory device 1000 also includes a periphery region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIGS. 2 and 19, the air gap G is formed over the pattern-dense region "A" of the semiconductor structure 100 or 100', while no air gap is formed in the pattern-loose region "B" of the semiconductor structure 100 or 100'. The pattern-dense region "A" may be any of the regions of the memory cells 30 in the memory device 1000, and the pattern-loose region "B" may be any of the regions of the address buffer, the row decoder, or the column decoder in the memory device 1000.

Embodiments of the semiconductor structures 100 and 100' are provided in the disclosure. The semiconductor structures 100 and 100' include a plurality of conductive plugs 125a, 125b, 127a, 127b over the pattern-dense region "A" and the pattern-loose region "B" of the semiconductor substrate 101, spacers 135a, 135b, 137a, 137b surrounding the conductive plugs 125a, 125b, 127a, 127b, respectively, and the dielectric layer 143 covering the conductive plugs 125a, 125b, 127a, 127b and the spacers 135a, 135b, 137a, 137b. Particularly, the dielectric layer 143 has a first portion P1 between the spacers 135a and 137a over the pattern-dense region "A" and a second portion P2 between the spacers 135b and 137b over the pattern-loose region "B", the first portion P1 of the dielectric layer 143 is separated from the semiconductor substrate 101 by an air gap G while the second portion P2 of the dielectric layer is in direct contact with the semiconductor substrate 101. Therefore, the parasitic capacitance between the conductive plugs 125a and 127a over the pattern-dense region "A" may be reduced. As a result, the overall device performance may be improved (i.e., the decreased power consumption and resistive-capacitive (RC) delay).

Figure 21:
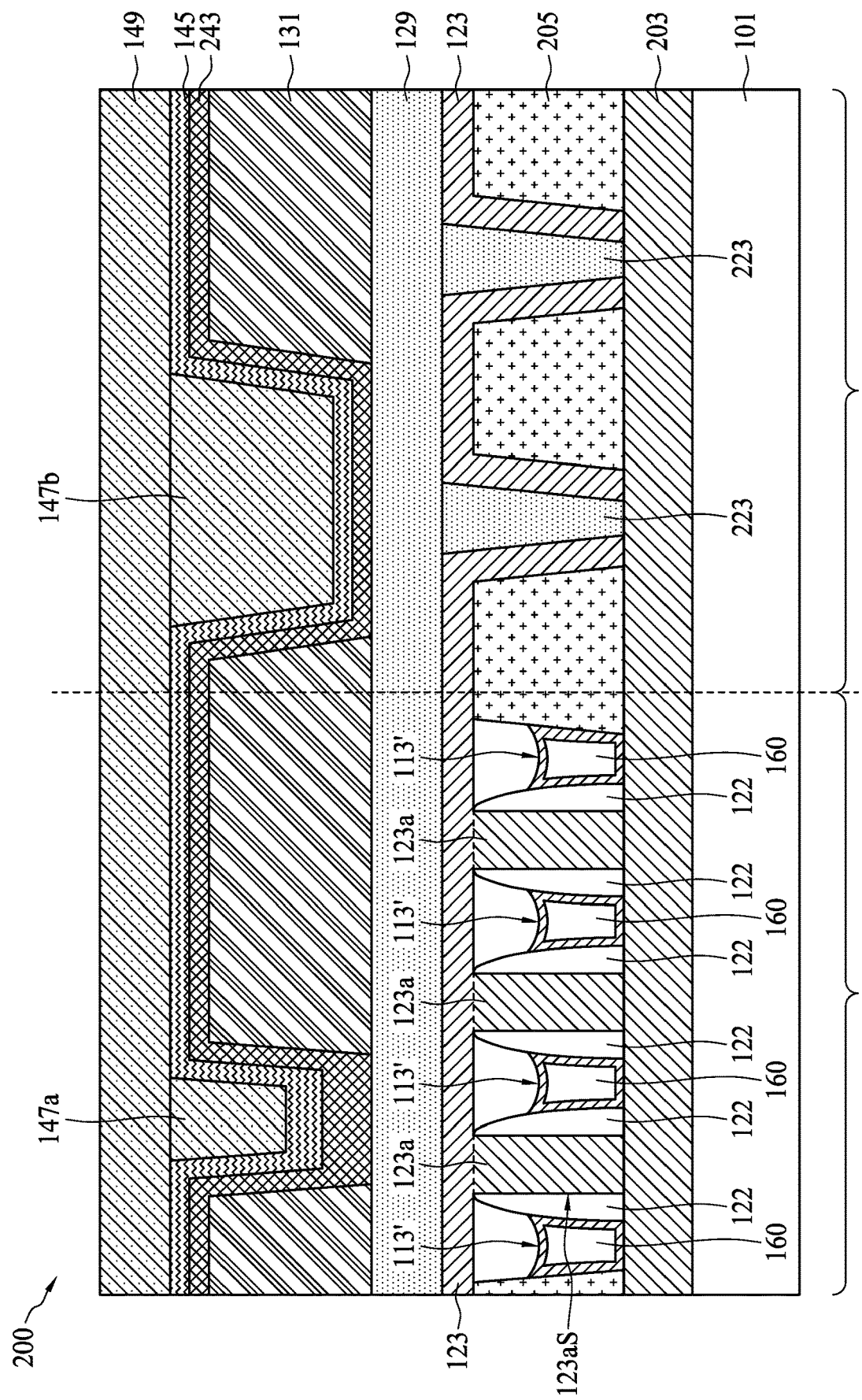
FIG. 21 is a cross-sectional view illustrating a semiconductor structure, in accordance with some embodiments.

FIG. 21 is a cross-sectional view illustrating a semiconductor structure 100, in accordance with some embodiments. As shown in FIG. 21, the semiconductor structure 200 includes a first conductive layer 203 arranged over a semiconductor substrate 101, a dielectric layer 205 arranged over the first conductive layer 203, a second conductive layer 129 arranged over the dielectric layer 205, a dielectric layer 131 arranged over the second conductive layer 129, and a third conductive layer 149 arranged over the dielectric layer 131, as shown in FIG. 21 in accordance with some embodiments. Moreover, the semiconductor structure 200 has a pattern-dense region "A" and a pattern-loose region "B". In order to clarify the disclosure, the dotted line in the middle of FIG. 21 is used to indicate the boundary of the pattern-dense region "A" and the pattern-loose region "B".

In some embodiments, the semiconductor structure 200 includes a plurality of first conductive plugs 123a penetrating through the dielectric layer 205 and arranged over the pattern-dense region "A". Moreover, the semiconductor structure 200 includes energy removable structures 113' arranged in the dielectric layer 205 and over the pattern-dense region "A". Specifically, the first conductive plugs 123a are surrounded by the energy removable structures 113', and each of the energy removable structures 113' includes an air gap 160. The material and configuration of the energy removable structures 113' may be similar to those of the energy removable structure 151'. In some embodiments, the energy removable structures 113' are absent from FIG. 21, and only the air gaps 160 are formed between the adjacent spacers 122.

In some embodiments, the air gaps 160 are enclosed by the energy removable structures 113'. Although four energy removable structures 113' are shown in the cross-sectional view of FIG. 21, the four energy removable structures 113' may be connected to each other in different cross-sectional views. Similar to the energy removable structures 113', the four air gaps 160 shown in the cross-sectional view of FIG. 21 may also be connected to each other in different cross-sectional views. It should be noted that the numbers of the energy removable structures 113' and the air gaps 160 may be adjusted depending on design requirements of the semiconductor structure 200.

Still referring to FIG. 21, the semiconductor structure 200 includes a lining layer 123 arranged between the dielectric layer 205 and the second conductive layer 129, and the energy removable structures 113' and the first conductive plugs 123a are covered by the lining layer 123. In some embodiments, the dashed lines are used to indicate the boundaries of the first conductive plugs 123a and the lining layer 123. May be no obvious interfaces exists between the first conductive plugs 123a and the lining layer 123.

The semiconductor structure 200 also includes a plurality of second conductive plugs 223 penetrating through the lining layer 123 and the dielectric layer 205 and in the pattern-loose region "B". Specifically, in the pattern-loose region "B", the lining layer 123 extends between the dielectric layer 205 and the second conductive plugs 223. In some embodiments, the second conductive plugs 223 are separated from the dielectric layer 205 by the lining layer 123.

In addition, the semiconductor structure 200 includes a lining layer 243, a lining layer 145, a first conductive structure 147a and a second conductive structure 147b arranged between the second conductive layer 129 and the third conductive layer 149. In some embodiments, the first conductive structure 147a is arranged over the pattern-dense region "A", and the second conductive structure 147b is arranged over the pattern-loose region "B". In some embodiments, portions of the lining layers 243 and 145 are sandwiched between the dielectric layer 131 and the third conductive layer 149. In some embodiments, the lining layer 145 is arranged over the lining layer 243, and the sidewalls and bottom surfaces of the first conductive structure 147a and the second conductive structure 147b are covered by the lining layer 145.

In some embodiments, the semiconductor structure 200 is a dynamic random access memory (DRAM). In these cases, the conductive layers (e.g., the first conductive layer 203, the second conductive layer 129 and the third conductive layer 149) can serve as bit lines (BL), storage nodes and/or wiring layers for the DRAM, and the conductive plugs (e.g., the first conductive plugs 123a and the second conductive plugs 223) and the conductive structures (e.g., the first conductive structure 147a and the second conductive structure 147b) can serve as bit line contact plugs, capacitor contact plugs and/or interconnect structures for the DRAM.

In some embodiments, the first conductive plugs 123a over the pattern-dense region "A" and the lining layer 123 are integrally formed. In some embodiments, the first conductive plugs 123a and the lining layer 123 comprise the same material, and the first conductive plugs 123a and the second conductive plugs 223 comprise different materials. In some embodiments, the first conductive plugs 123a and the lining layer 123 comprise a manganese-containing material.

For example, the lining layer 123 and the first conductive plugs 123a each comprise (or include) copper manganese (CuMn), while the first conductive layer 203, the second conductive layer 129 and the second conductive plugs 223 each comprise (or include) copper (Cu), in accordance with some embodiments. Additionally, in some embodiments, the first conductive structure 147a, the second conductive structure 147b and the third conductive layer 149 each comprise (or include) copper (Cu), the lining layer 243 comprises (or include) manganese-rich manganese silicon (MnSi) or manganese (Mn), and the lining layer 145 comprises (or includes) copper manganese (CuMn).

Figure 22:
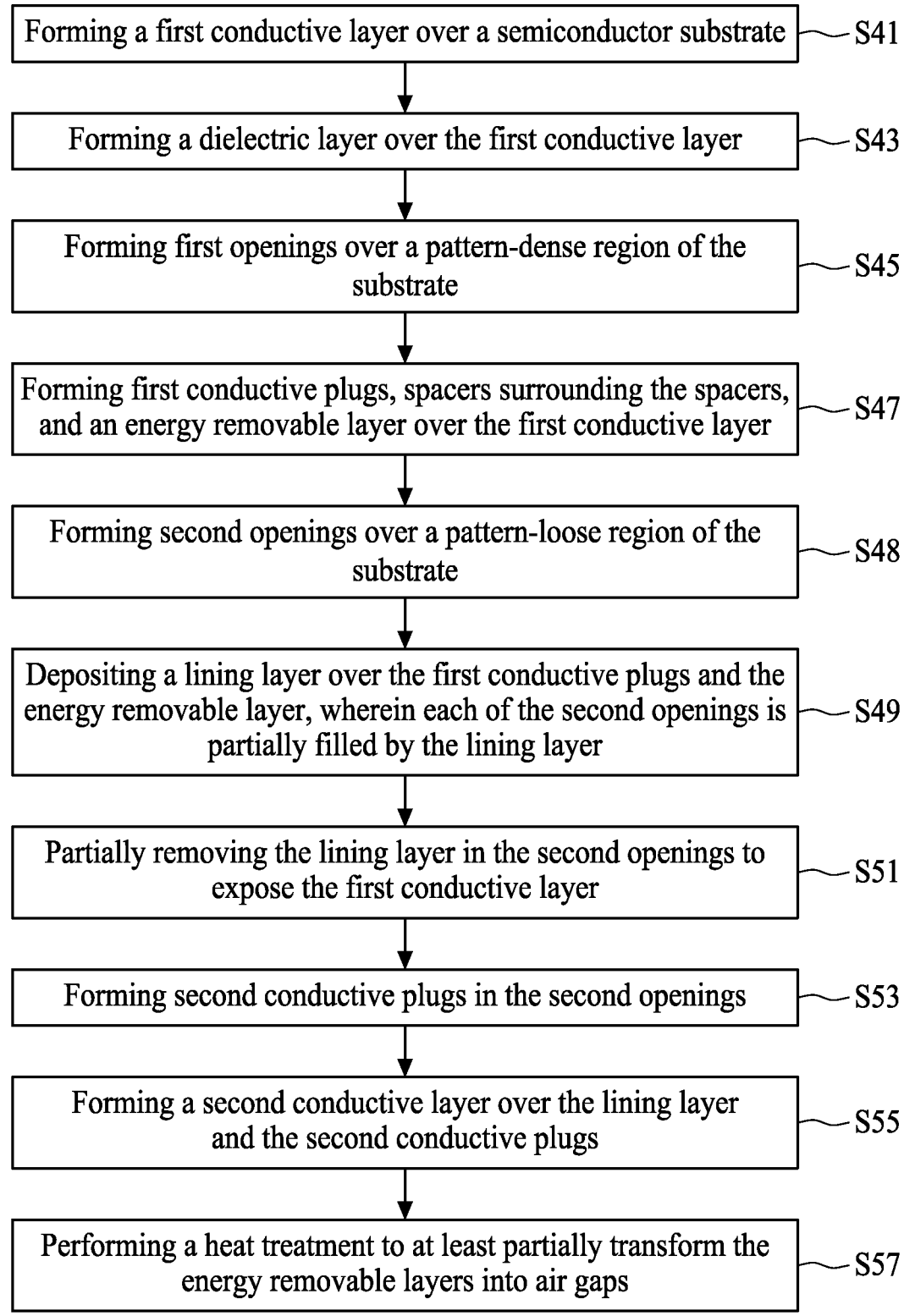
FIG. 22 is a flow diagram illustrating a method for forming a semiconductor structure, in accordance with some embodiments.

FIG. 22 is a flow diagram illustrating a method 40 of forming a semiconductor structure (e.g., the semiconductor structure 200), and the method 40 includes steps S41, S43, S45, S47, S48, S49, S51, S53, S55 and S57, in accordance with some embodiments. The steps S41 to S57 of FIG. 22 are elaborated in connection with the following figures.

Figure 23:
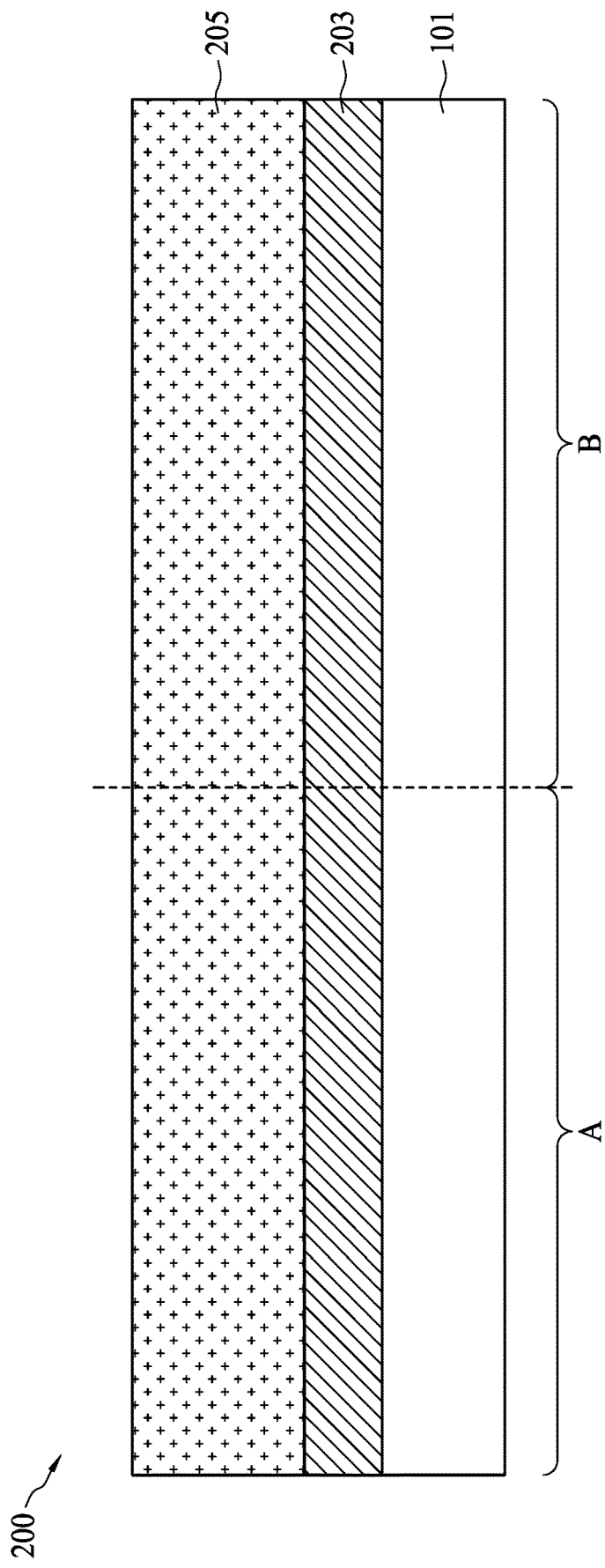
FIG. 23 is a cross-sectional view illustrating an intermediate stage of sequentially forming a first conductive layer and a dielectric layer over a semiconductor substrate during the formation of the semiconductor structure, in accordance with some embodiments.

FIGS. 23-39 are cross-sectional views illustrating intermediate stages of forming the semiconductor structure 200, in accordance with some embodiments. As shown in FIG. 23, the semiconductor substrate 101 is provided. The semiconductor substrate 101 shown in FIG. 23 may be similar to that shown in FIGS. 1 and 5-19. The semiconductor substrate 101 may be a semiconductor wafer such as a silicon wafer.

Still referring to FIG. 23, the first conductive layer 203 is formed over the semiconductor substrate 101, and the dielectric layer 205 is formed over the first conductive layer 203, in accordance with some embodiments. The respective steps are illustrated as the steps S41 and S43 in the method 40 shown in FIG. 22.

In some embodiments, the first conductive layer 203 includes copper (Cu), and the first conductive layer 203 is formed by a deposition process, such as a chemical vapor deposition (CVD) process, a physical vapor deposition (PVD) process, an atomic layer deposition (ALD) process, a metal organic chemical vapor deposition (MOCVD) process, a sputtering process, a plating process, or another applicable process. In some embodiments, the dielectric layer 205 includes silicon oxide, silicon nitride, silicon oxynitride, or another applicable dielectric material, and the dielectric layer 205 is formed by a deposition process, such as a CVD process, a PVD process, an ALD process, a spin-on coating process, or another applicable process.

Figure 24:
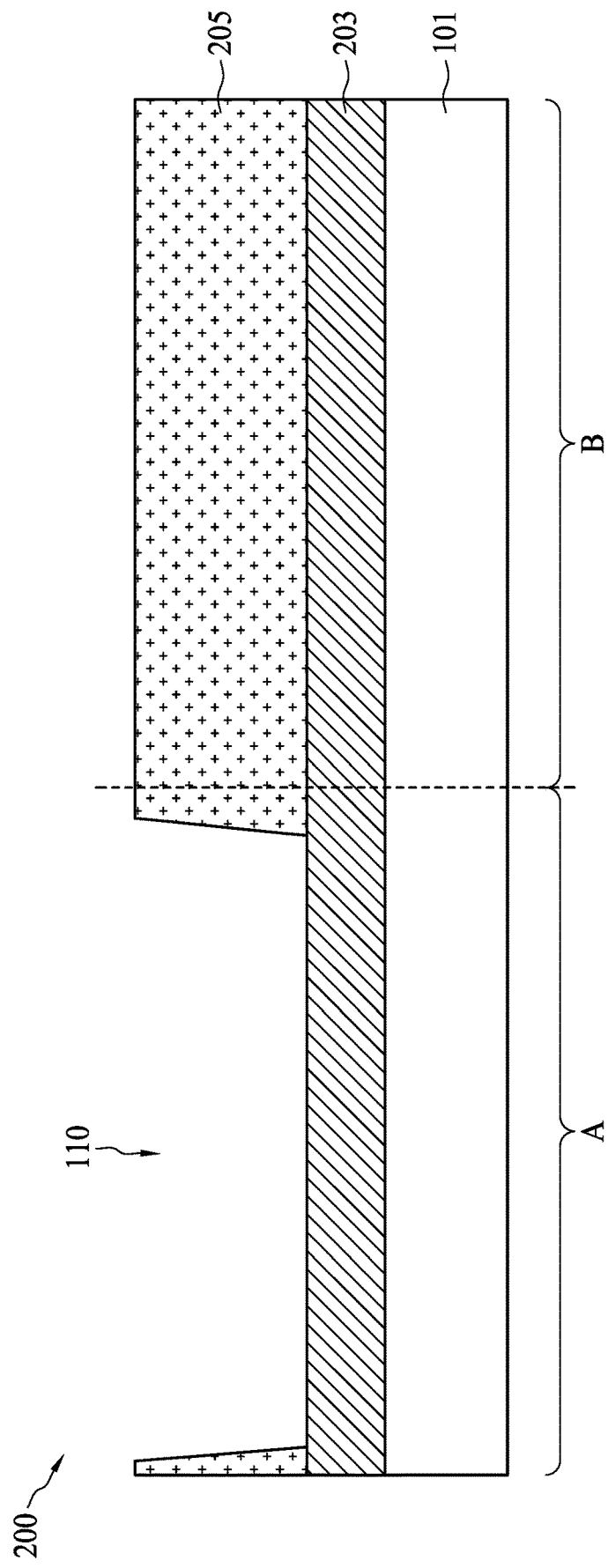
FIG. 24 is a cross-sectional view illustrating an intermediate stage of etching the dielectric layer during the formation of the semiconductor structure, in accordance with some embodiments.

Next, an etching process is performed on the dielectric layer 205 to form an opening 110 exposing the first conductive layer 203, as shown in FIG. 24 in accordance with some embodiments. The respective step is illustrated as step S45 in the method 40 shown in FIG. 22. In some embodiments, the opening 110 is over the pattern-dense region "A". The formation of the opening 110 may include forming a patterned mask (not shown) over the dielectric layer 205, and etching the dielectric layer 205 by using the patterned mask as a mask. In addition, the etching process for forming the opening 110 may be a wet etching process, a dry etching process, or a combination thereof.

Figure 25:
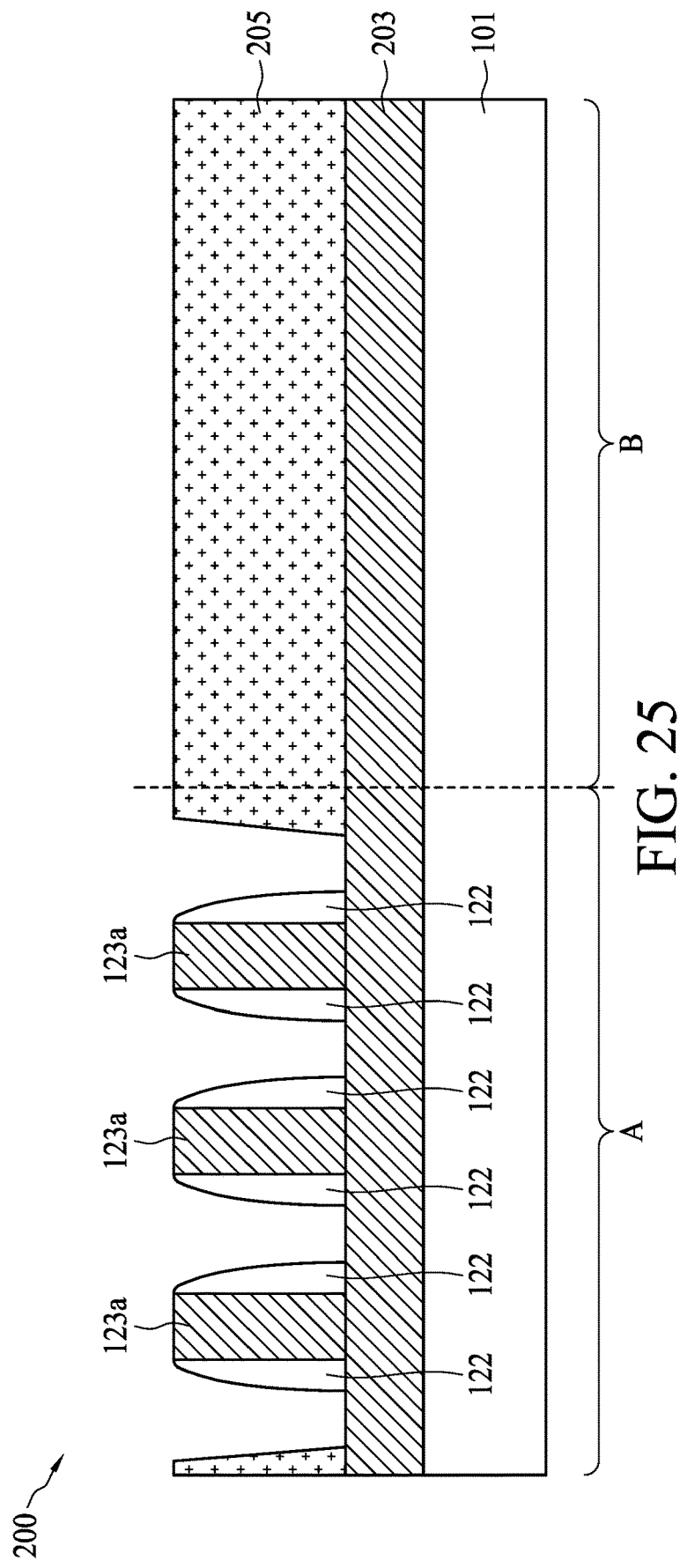
FIG. 25 is a cross-sectional view illustrating an intermediate stage of forming first conductive plugs and spacers during the formation of the semiconductor structure, in accordance with some embodiments.

Referring to FIG. 25, a plurality of first conductive plugs 123a are formed in the opening 110 over the first conductive layer 203. In some embodiments, spacers 122 are formed surrounding the respective conductive plugs and on sidewalls 123aS of the conductive plugs 123a. The materials, configurations and method of forming for the first conductive plugs 123a and the spacers 122 are similar to those of the conductive plugs 125, 127, and the spacers 135, 137, respectively, and these similar descriptions will not be repeated for brevity. In some embodiments, an energy removable layer 113 (see FIG. 27) is formed between the adjacent spacers 122 or between the adjacent conductive plugs 123a. The respective step is illustrated as step S47 in the method 40 shown in FIG. 22.

Figure 26:
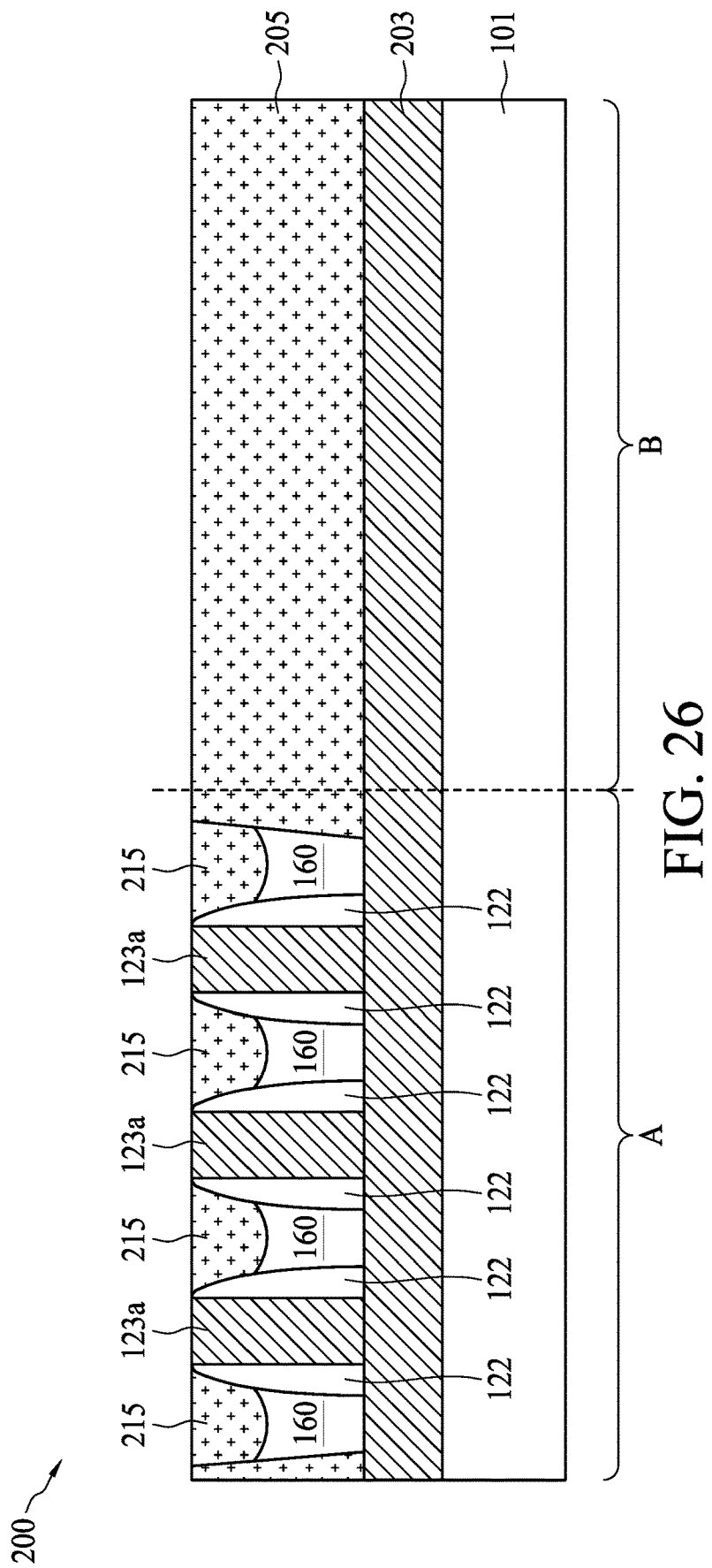
FIG. 26 is a cross-sectional view illustrating an intermediate stage of forming air gaps during the formation of the semiconductor structure, in accordance with some embodiments.

Referring to FIG. 26, after the spacers 122 are formed, a dielectric layer 215 is deposited over the structure of FIG. 25, such that air gaps 160 are formed over the pattern-dense region "A", in accordance with some embodiments. In some embodiments, the material and method of forming for the dielectric layer 215 are similar to those for the dielectric layer 143. The respective step is illustrated as the step S45 in the method 40 shown in FIG. 22. In some embodiments, a planarization process, such as CMP, is performed to remove excess portions of the dielectric layer 215 and level the surface of the dielectric layer 215 with the upper surface of the dielectric layer 205 and the upper surfaces of the first conductive plugs 123a.

Figure 27:
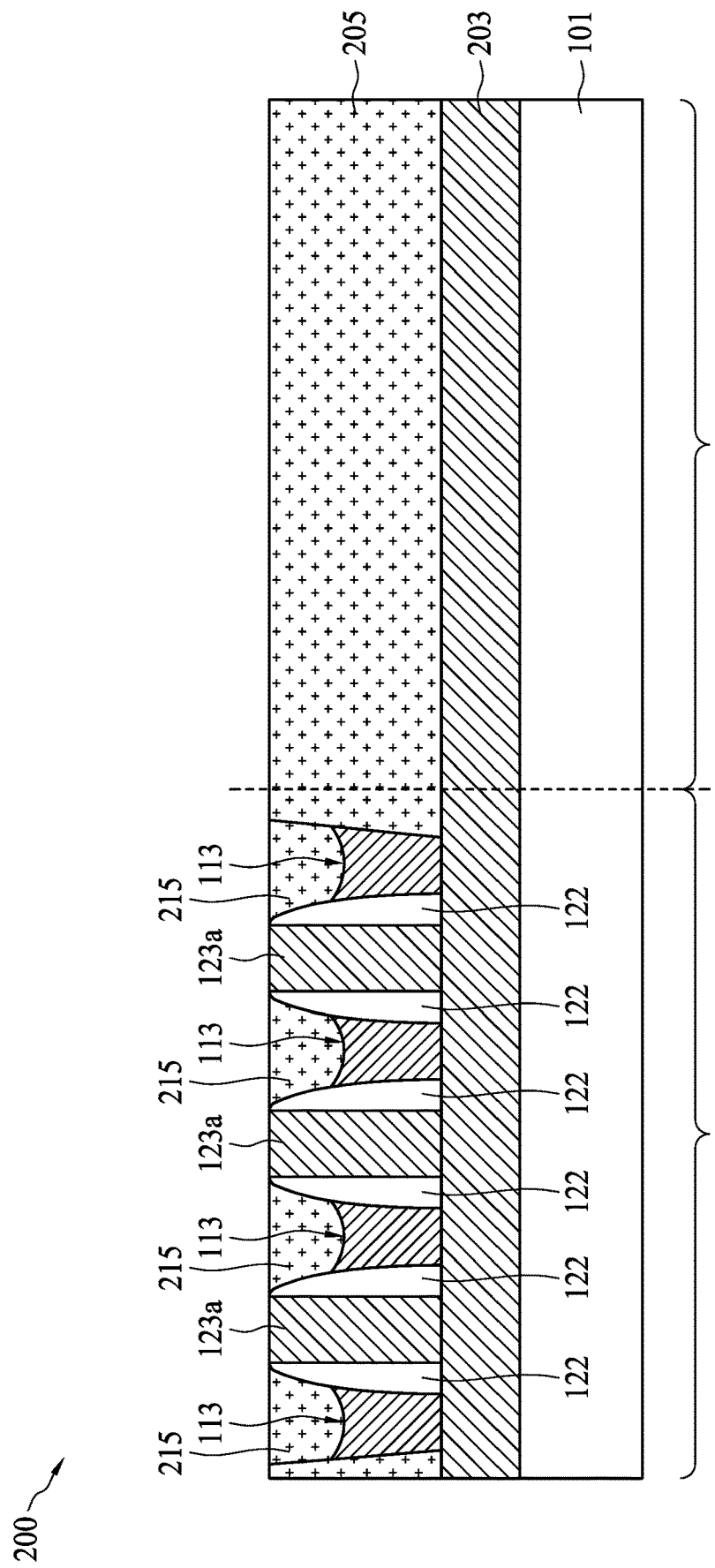
FIG. 27 is a cross-sectional view illustrating an intermediate stage of forming energy removable layers during the formation of the semiconductor structure, in accordance with some embodiments.

FIG. 27 is a cross-sectional views illustrating an intermediate stage in the formation of the semiconductor structure 200, in accordance with some embodiments. The embodiment of forming method shown in FIG. 27 is different from the embodiment of forming method shown in FIG. 26.

Referring to FIG. 27, an energy removable layer 113 is deposited between the spacers 122 over the first conductive layer 203. In some embodiments, the energy removable layer 113 is formed by performing a deposition process that deposits the energy removable layer 113 between the spacers 122 over the pattern-dense region "A" rather than over the pattern-loose region "B". In some embodiments, portions of the sidewalls and an entirety the bottom surface of the opening 110 are covered by the energy removable layer 113. The material, the configuration and the method of forming of the energy removable layer 113 may be similar to those of the energy removable layer 151.

In some embodiments, a planarization process, such as CMP, is performed to remove excess portions of the dielectric layer 215 and level the surface of the dielectric layer 215 with the upper surface of the dielectric layer 205 and the upper surfaces of the first conductive plugs 123a.

FIGS. 28-39 are cross-sectional views illustrating intermediate stages in the formation of the semiconductor structure 200 following one of the embodiments shown in FIG. 26 or FIG. 27, in accordance with some embodiments. That means, the intermediate stages shown with reference to FIGS. 28-39 are shared by the embodiment with reference to FIG. 26 and the embodiment with reference to FIG. 27. In the depicted example, the embodiment with reference to FIG. 27, where the energy removable layers 113 are formed between the spacers 22, is illustrated in FIGS. 28-39.

Figure 28:
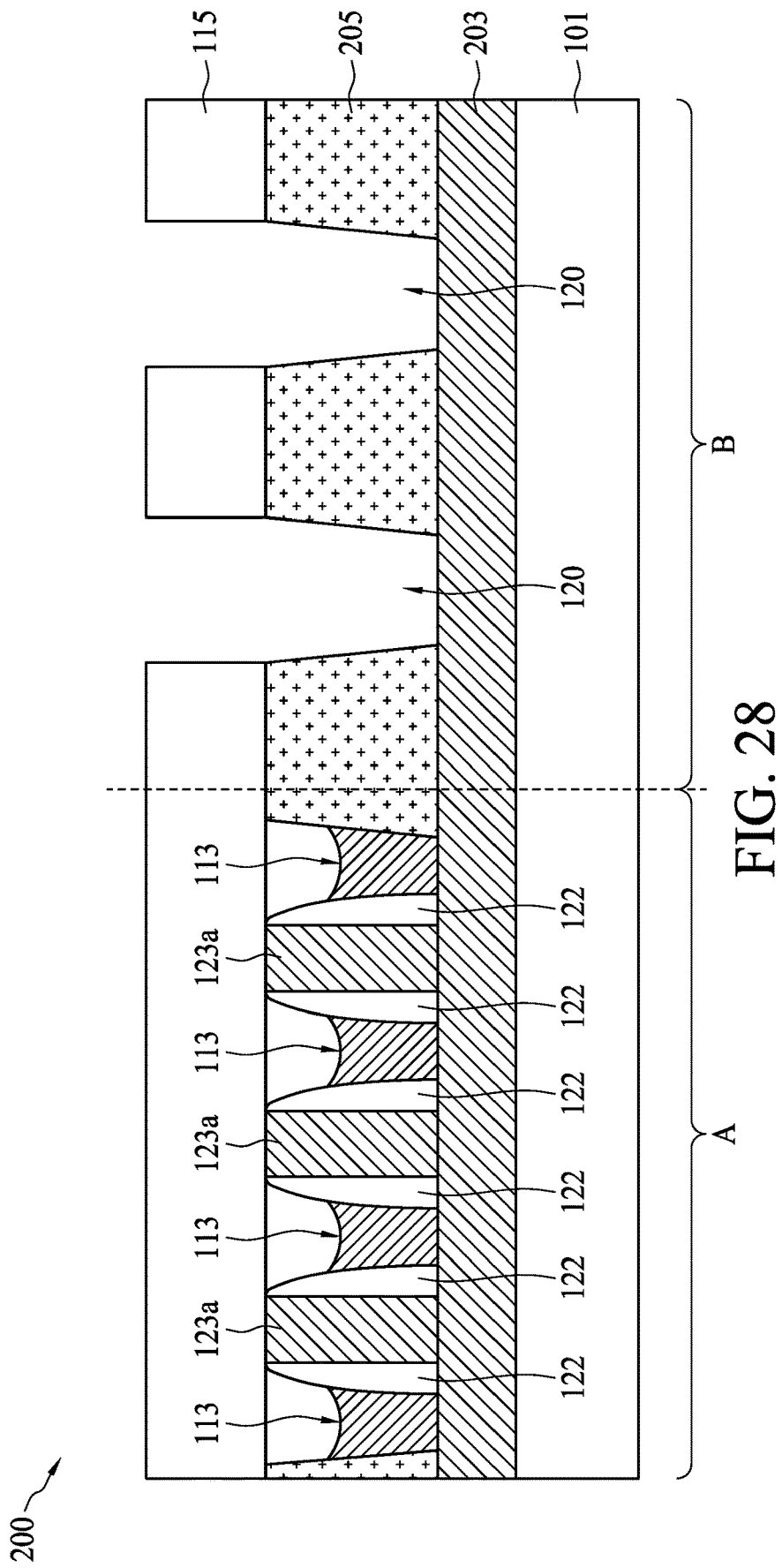
FIG. 28 is a cross-sectional view illustrating an intermediate stage of etching the dielectric layer during the formation of the semiconductor structure, in accordance with some embodiments.

Referring to FIG. 28, a patterned mask 115 is formed over the energy removable layer 113 and the dielectric layer 205. In some embodiments, portions of the dielectric layer 205 in the pattern-loose region "B" are exposed by the patterned mask 115 while the pattern-dense region "A" are covered by the patterned mask 115.

Figure 29:
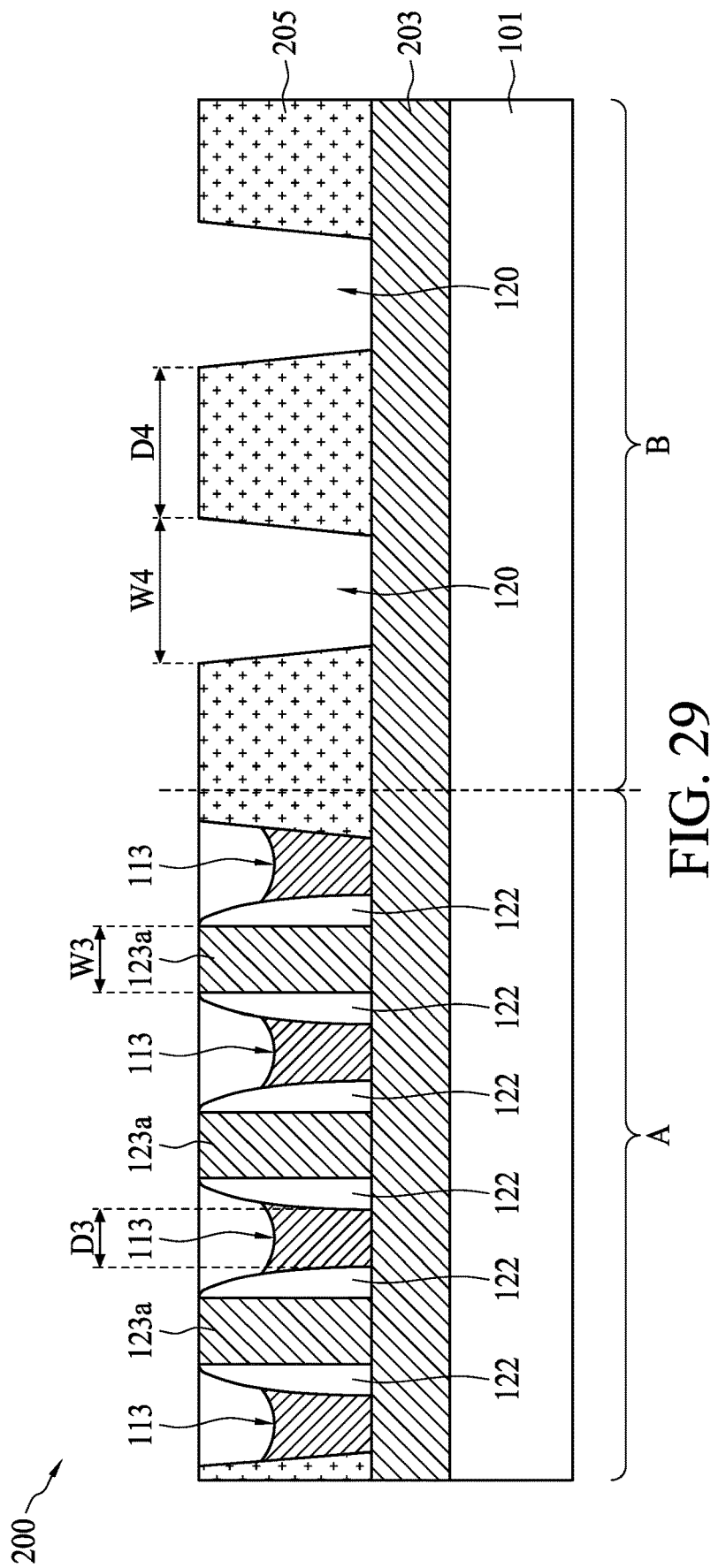
FIG. 29 is a cross-sectional view illustrating an intermediate stage of removing a patterned mask during the formation of the semiconductor structure, in accordance with some embodiments.

Subsequently, the dielectric layer 205 are etched by using the patterned mask 115 as a mask, such that openings 120 are formed in the dielectric layer 205, as shown in FIG. 29 in accordance with some embodiments. In some embodiments, the openings 120 are arranged over the pattern-loose region "B". In some embodiments, the first conductive layer 203 are partially exposed by the openings 120. The etching process may be a wet etching process, a dry etching process, or a combination thereof. The respective step is illustrated as the step S48 in the method 40 shown in FIG. 22.

After the openings 120 are formed, the patterned mask 115 is removed, as shown in FIG. 29 in accordance with some embodiments. In some embodiments, each of the first conductive plugs 123a has a width W3, each of the openings 120 has a width W4, and the width W4 is greater than the width W3. In some embodiments, the widths W3 and W4 are defined as the topmost widths of the first conductive plugs 123a and the openings 120. Additionally, in some embodiments, each adjacent pair of the spacers 22 have a distance D3 therebetween around the bottoms of the spacers, each adjacent pair of the openings 120 have a distance D4 therebetween, and the distance D4 is greater than the distance D3.

Figure 30:
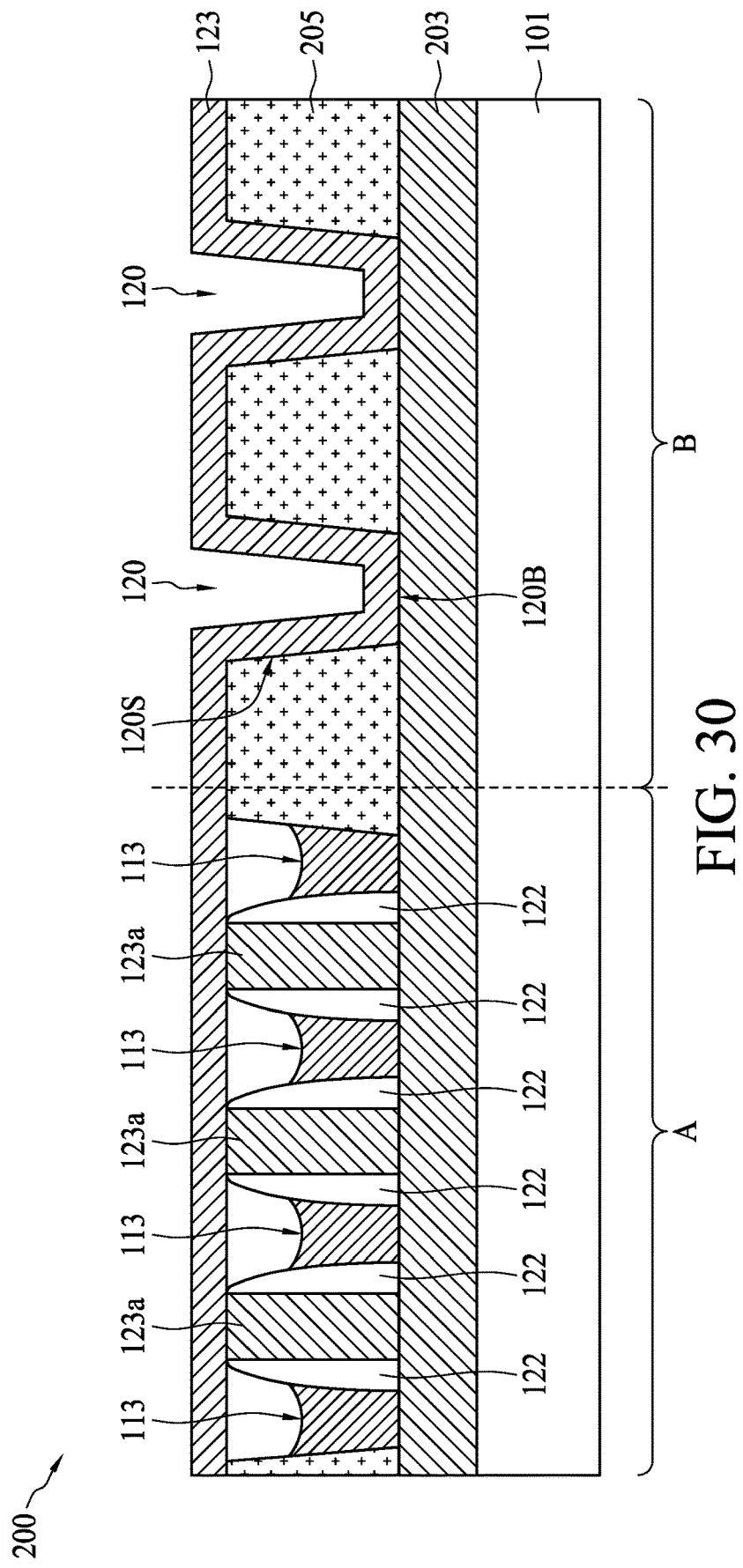
FIG. 30 is a cross-sectional view illustrating an intermediate stage of depositing a lining layer during the formation of the semiconductor structure, in accordance with some embodiments.

Next, the lining layer 123 is deposited over the energy removable layer 113 and the dielectric layers 205 and 215, as shown in FIG. 30 in accordance with some embodiments. In some embodiments, each of the openings 120 is partially filled by the lining layer 123, such that the remaining portions of the openings 120 are left over the lining layer 123. In some embodiments, the lining layer 123 lines the sidewalls 120S and bottoms 120B of each of the openings 120. The respective step is illustrated as the step S49 in the method 40 shown in FIG. 22.

In some embodiments, the lining layer 123 and the first conductive plugs 123a comprise the same material, such as a manganese-containing material. In some embodiments, the lining layer 123 and the first conductive plugs 123a comprise (or include) copper manganese (CuMn). Moreover, the lining layer 123 may be formed by a deposition process, such as a CVD process, a PVD process, an ALD process, or another applicable process.

Figure 31:
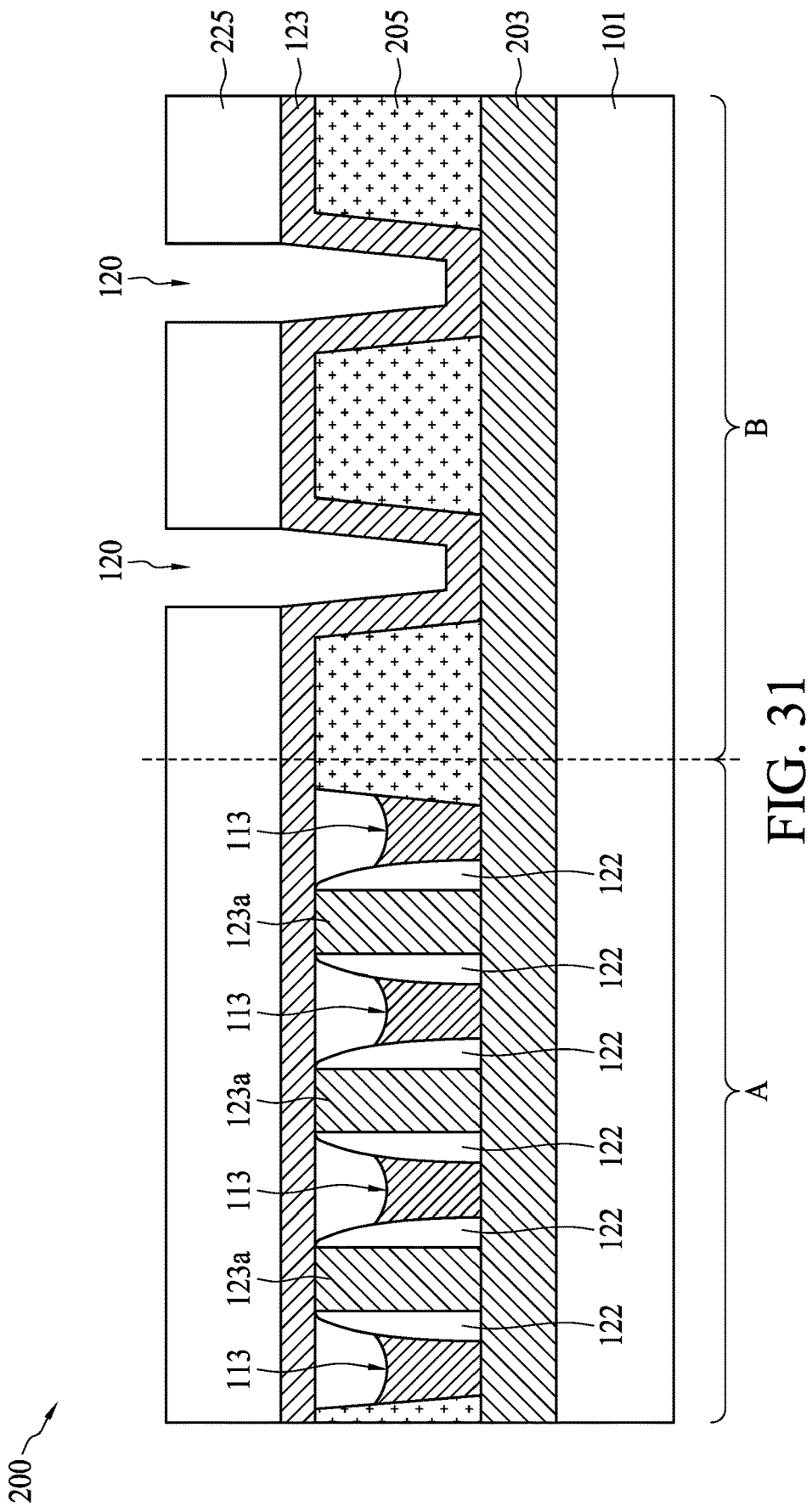
FIG. 31 is a cross-sectional view illustrating an intermediate stage of forming a patterned mask over the lining layer during the formation of the semiconductor structure, in accordance with some embodiments.

Subsequently, a patterned mask 225 is formed over the lining layer 123, as shown in FIG. 31 in accordance with some embodiments. In some embodiments, portions of the lining layer 123 in the bottom of the openings 120 are exposed by the patterned mask 225.

Figure 32:
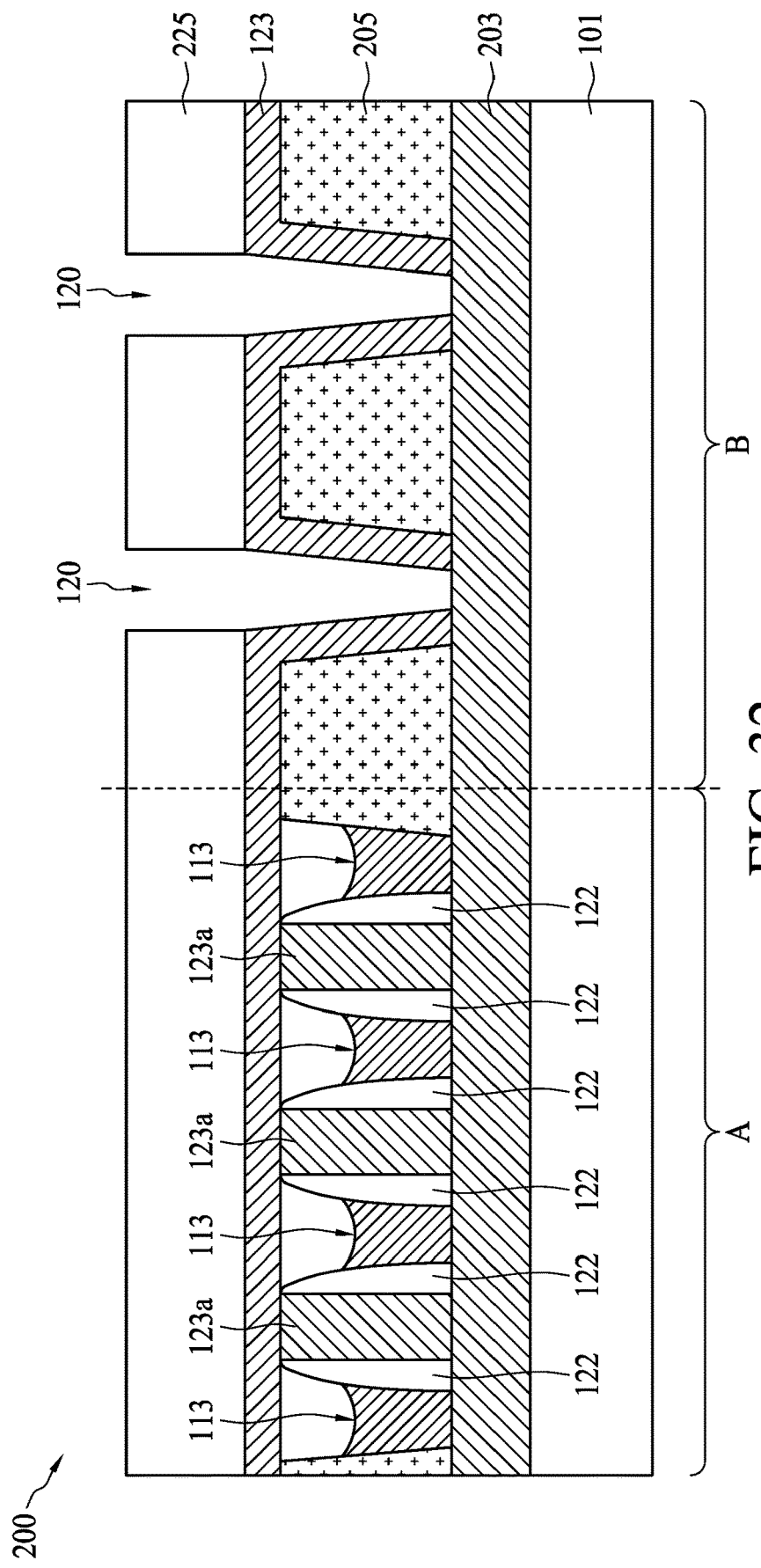
FIG. 32 is a cross-sectional view illustrating an intermediate stage of partially removing the lining layer to expose the first conductive layer during the formation of the semiconductor structure, in accordance with some embodiments.

Then, the lining layer 123 is etched by using the patterned mask 225 as a mask, such that the first conductive layer 203 is partially exposed by the openings 120, as shown in FIG. 32 in accordance with some embodiments. The etching process may be a wet etching process, a dry etching process, or a combination thereof. The respective step is illustrated as the step S51 in the method 40 shown in FIG. 22.

Figure 33:
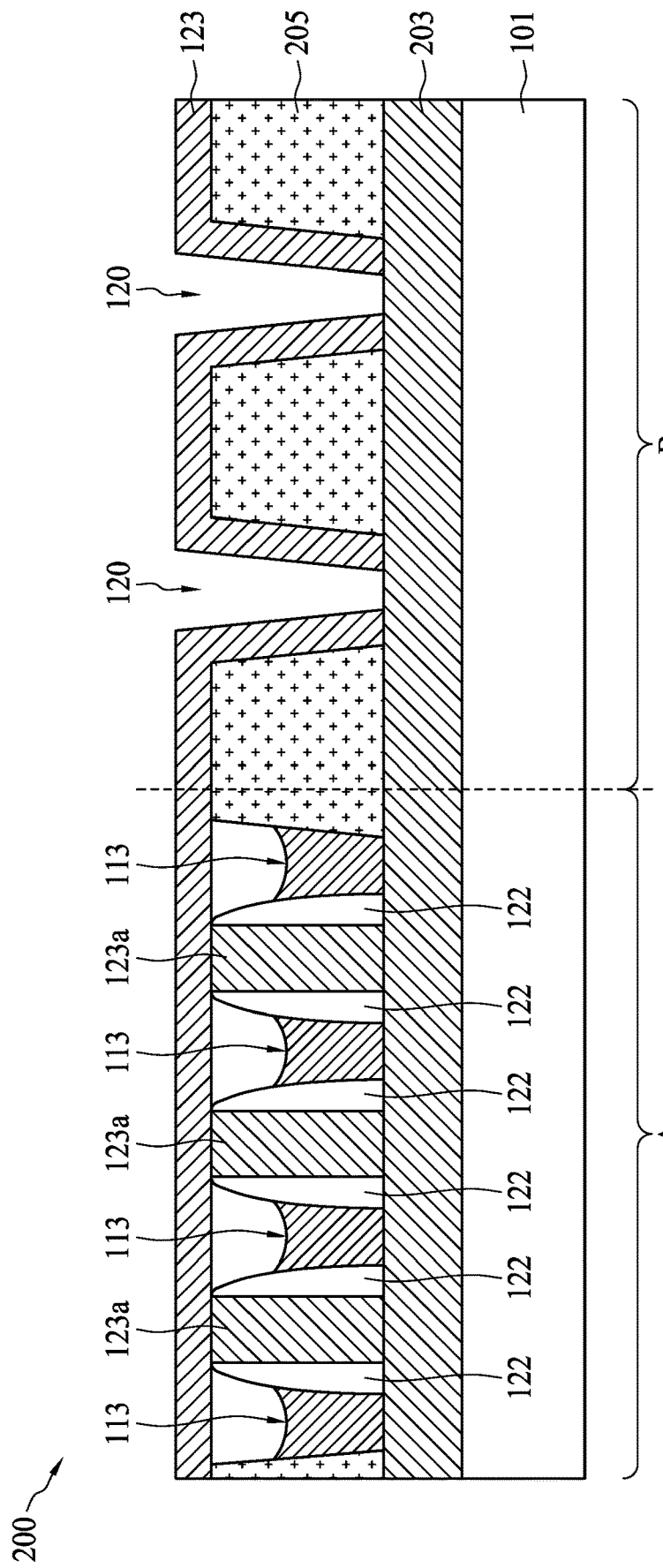
FIG. 33 is a cross-sectional view illustrating an intermediate stage of removing the patterned mask during the formation of the semiconductor structure, in accordance with some embodiments.

After the first conductive layer 203 is partially exposed by the openings 120 in the pattern-loose region "B", the patterned mask 225 is removed, as shown in FIG. 33 in accordance with some embodiments.

Figure 34:
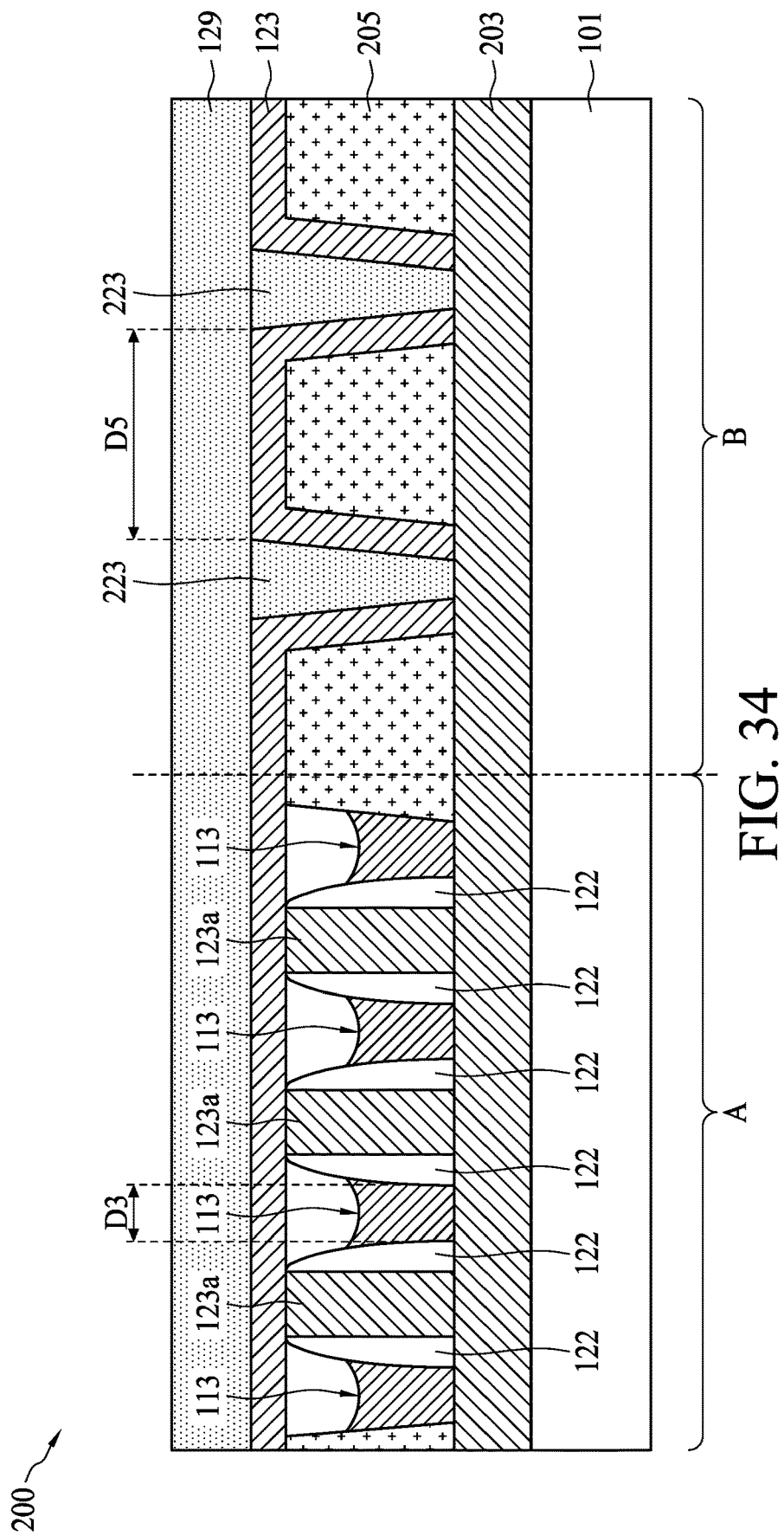
FIG. 34 is a cross-sectional view illustrating an intermediate stage of forming second conductive plugs and a second conductive layer during the formation of the semiconductor structure, in accordance with some embodiments.

Next, the second conductive plugs 223 are formed in a remaining portion the openings 120 (See FIG. 33) in the pattern-loose region "B". The respective step is illustrated as the step S53 in the method 40 shown in FIG. 22. The second conductive layer 129 is formed over the lining layer 123 and the second conductive plugs 223, as shown in FIG. 34 in accordance with some embodiments. The respective step are illustrated as the step S55 in the method 40 shown in FIG. 22. In some embodiments, the second conductive plugs 223 and the second conductive layer 129 are integrally formed or formed during a same deposition process.

Specifically, in some embodiments, the second conductive plugs 223 and the second conductive layer 129 are formed simultaneously in the same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the second conductive plugs 223 and the second conductive layer 129 comprise (or include) copper (Cu). Additionally, in some embodiments, each adjacent pair of the first conductive plugs 123a over the pattern-dense region "A" have a distance D5 therebetween, each adjacent pair of the second conductive plugs 223 over the pattern-loose region "B" have a distance D5 therebetween, and the distance D5 is greater than the distance D3.

Figure 35:
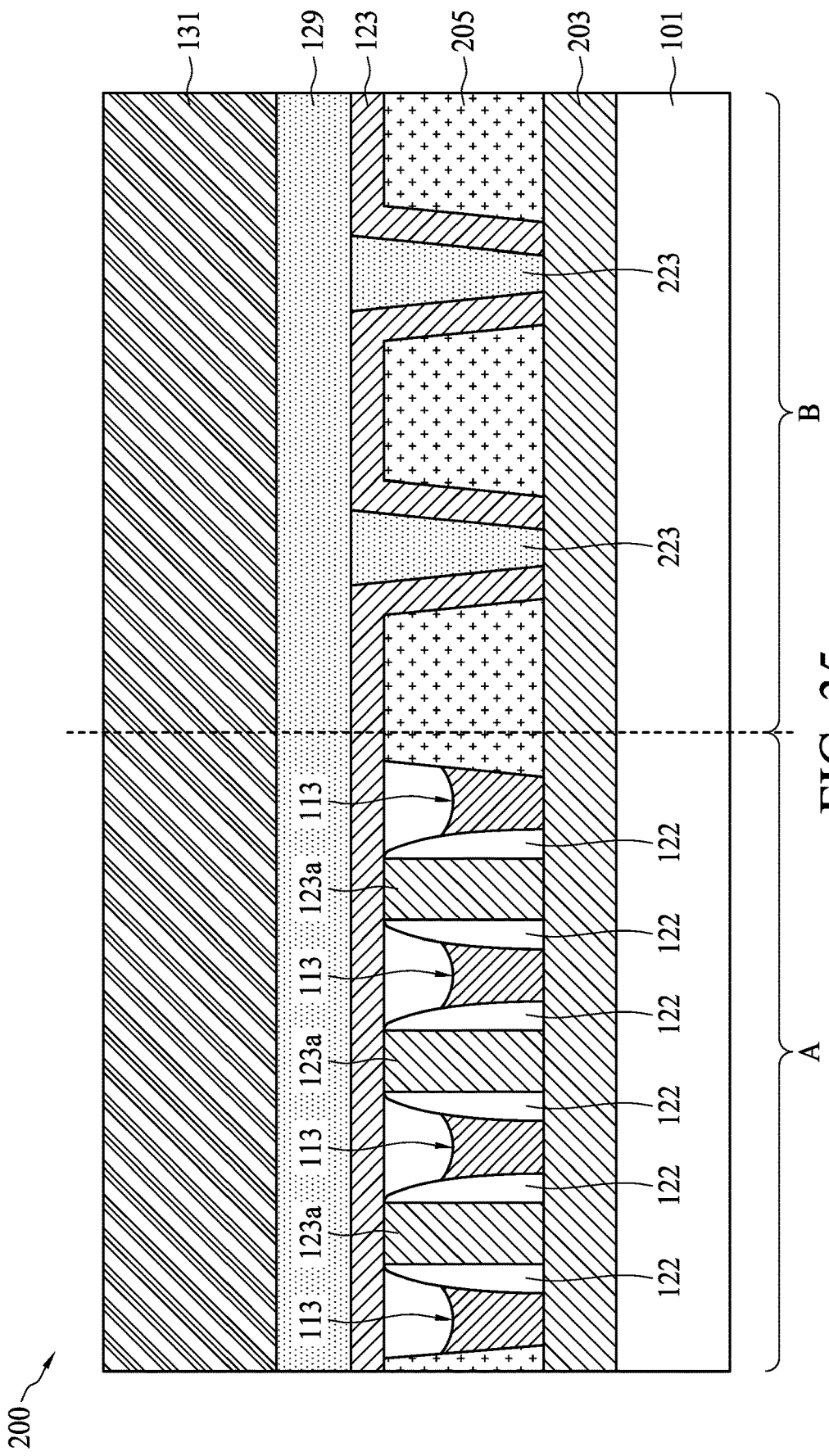
FIG. 35 is a cross-sectional view illustrating an intermediate stage of forming a dielectric layer over the second conductive layer during the formation of the semiconductor structure, in accordance with some embodiments.

Subsequently, the dielectric layer 131 is formed over the second conductive layer 129, as shown in FIG. 35 in accordance with some embodiments. Some materials and processes used to form the dielectric layer 131 are similar to, or the same as those used to form the dielectric layer 205, and details thereof are not repeated herein.

Figure 36:
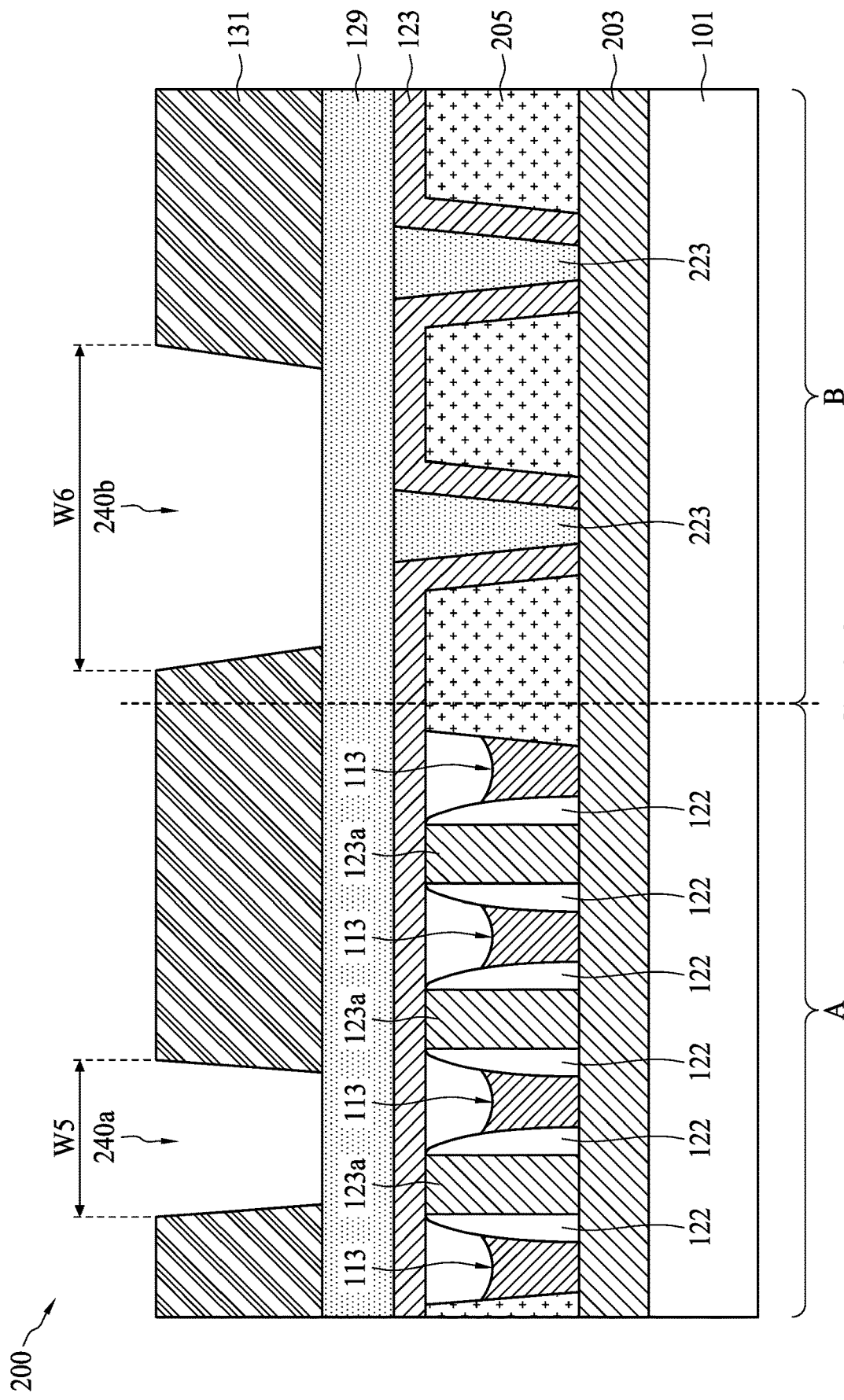
FIG. 36 is a cross-sectional view illustrating an intermediate stage of etching the dielectric layer during the formation of the semiconductor structure, in accordance with some embodiments.

Then, the dielectric layer 131 is etched to form an opening 240a over the pattern-dense region "A" and an opening 240b over the pattern-loose region "B", as shown in FIG. 36 in accordance with some embodiments. In some embodiments, each of the openings 240a and 240b exposes a portion of the second conductive layer 129. The etching process for forming the openings 240a and 240b may be a wet etching process, a dry etching process, or a combination thereof. In some embodiments, the opening 240a has a width W5, the opening 240b has a width W6, and the width W6 is greater than the width W5. In some embodiments, the widths W5 and W6 are defined as the topmost widths of the openings 240a and 240b.

Figure 37:
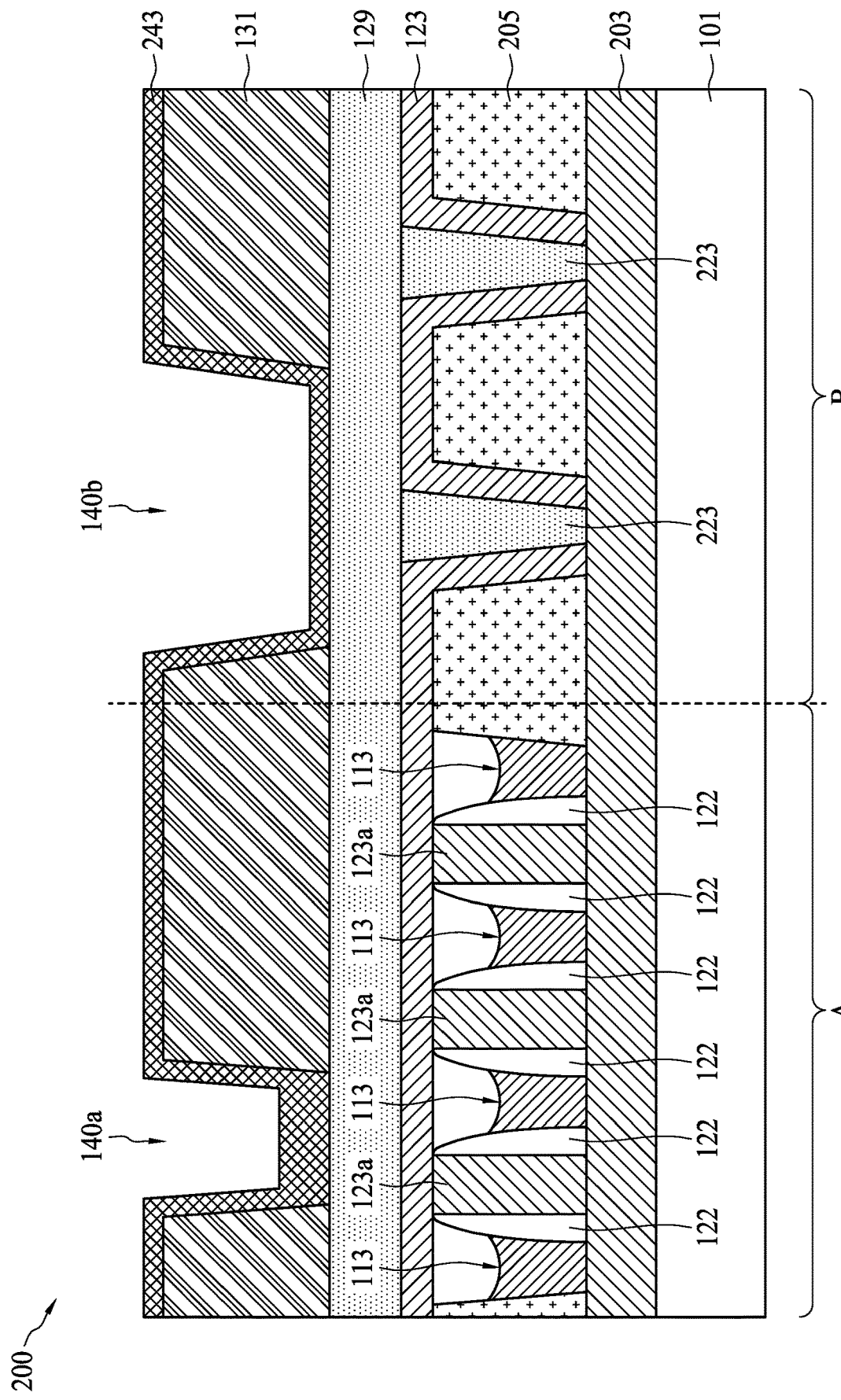
FIG. 37 is a cross-sectional view illustrating an intermediate stage of forming a lining layer during the formation of the semiconductor structure, in accordance with some embodiments.

After the openings 240a and 240b are formed, the lining layer 243 is conformally deposited over the dielectric layer 131 and covering the sidewalls and the bottom surfaces of the openings 240a and 240b, as shown in FIG. 37 in accordance with some embodiments. In some embodiments, the lining layer 243 comprises (or include) manganese-rich manganese silicon (MnSi) or manganese (Mn). The lining layer 243 may be formed by a deposition process, such as CVD, PVD, ALD, MOCVD, sputtering, plating.

Figure 38:
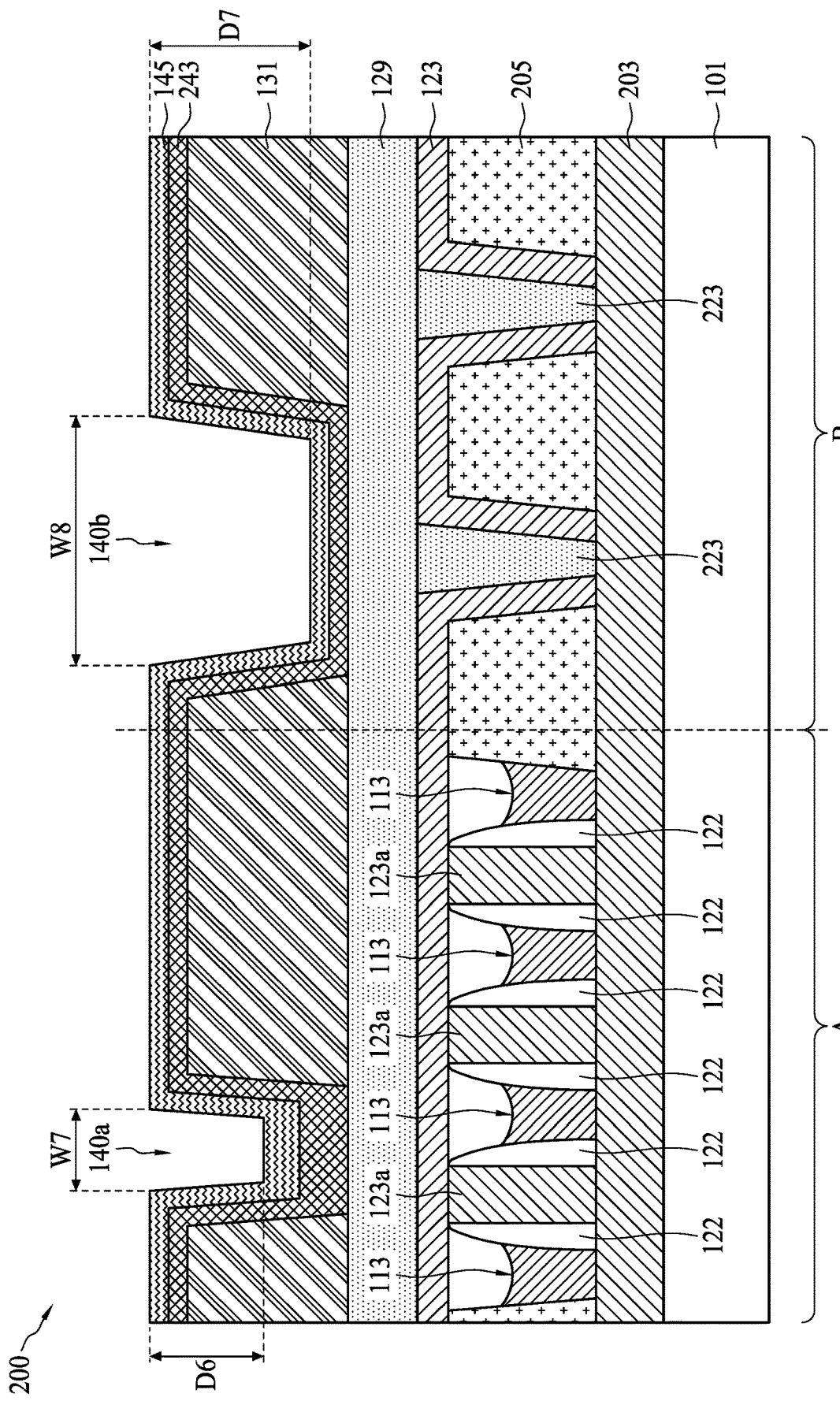
FIG. 38 is a cross-sectional view illustrating an intermediate stage of forming a lining layer during the formation of the semiconductor structure, in accordance with some embodiments.

Next, the lining layer 145 is conformally deposited over the lining layer 243, as shown in FIG. 38 in accordance with some embodiments. In some embodiments, the lining layer 145 comprises (or include) copper manganese (CuMn). Some processes used to form the lining layer 145 are similar to, or the same as those used to form the lining layer 243, and details thereof are not repeated herein.

Figure 39:
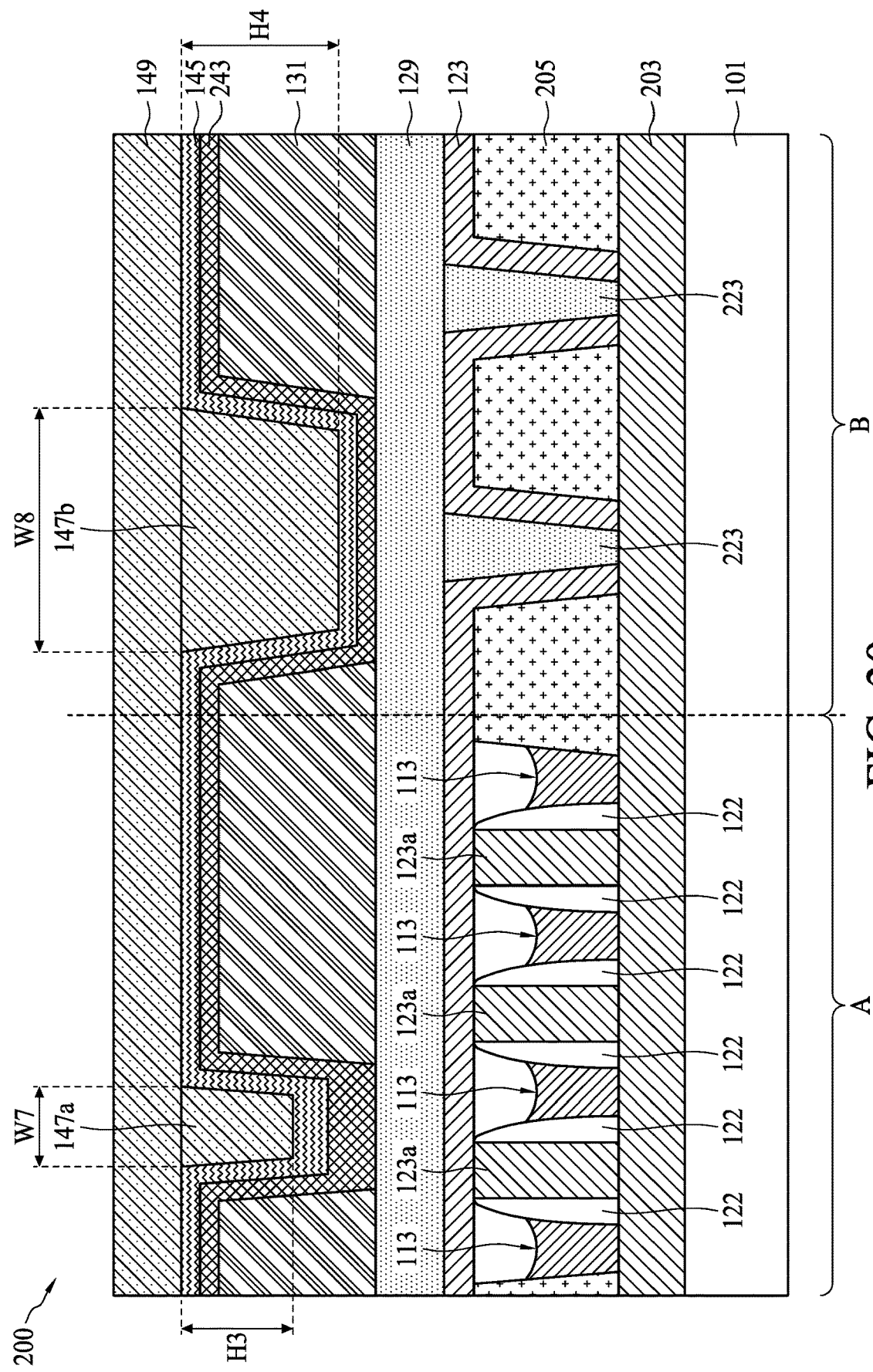
FIG. 39 is a cross-sectional view illustrating an intermediate stage of forming a first conductive structure, a second conductive structure and a third conductive layer during the formation of the semiconductor structure, in accordance with some embodiments.

Subsequently, the first conductive structure 147a is formed in the remaining portion of the opening 240a, the second conductive structure 147b is formed in the remaining portion of the opening 240b, and the third conductive layer 149 is formed over the lining layer 145, the first conductive structure 147a and the second conductive structure 147b, as shown in FIG. 39 in accordance with some embodiments. In some embodiments, the first conductive structure 147a, the second conductive structure 147b and the third conductive layer 149 are integrally formed.

Specifically, the first conductive structure 147a, the second conductive structure 147b and the third conductive layer 149 are formed simultaneously in the same process steps, such as a deposition process and a subsequent planarizing process. The deposition process may be a CVD process, a PVD process, an ALD process, a MOCVD process, a sputtering process, a plating process, or another applicable process. The planarizing process may include a CMP process, an etch-back process, or another applicable process. In addition, in some embodiments, the first conductive structure 147a, the second conductive structure 147b and the third conductive layer 149 comprise (or include) copper (Cu).

In some embodiments, the opening 240b over the pattern-loose region "B" is wider than the opening 240a over the pattern-dense region "A" (See FIG. 36, the width W6 is greater than the width W5). Therefore, after the lining layer 145 is formed, a width W8 of the remaining portion of the opening 240b is greater than a width W7 of the remaining portion of the opening 240a, and the depth D7 of the remaining portion of the opening 240b is greater than the depth D6 of the remaining portion of the opening 240a. As a result, the width W8 of the second conductive structure 147b is greater than the width W7 of the first conductive structure 147a, and a height H4 of the second conductive structure 147b is greater than a height H3 of the first conductive structure 147a, as shown in FIG. 39 in accordance with some embodiments.

Figure 40:
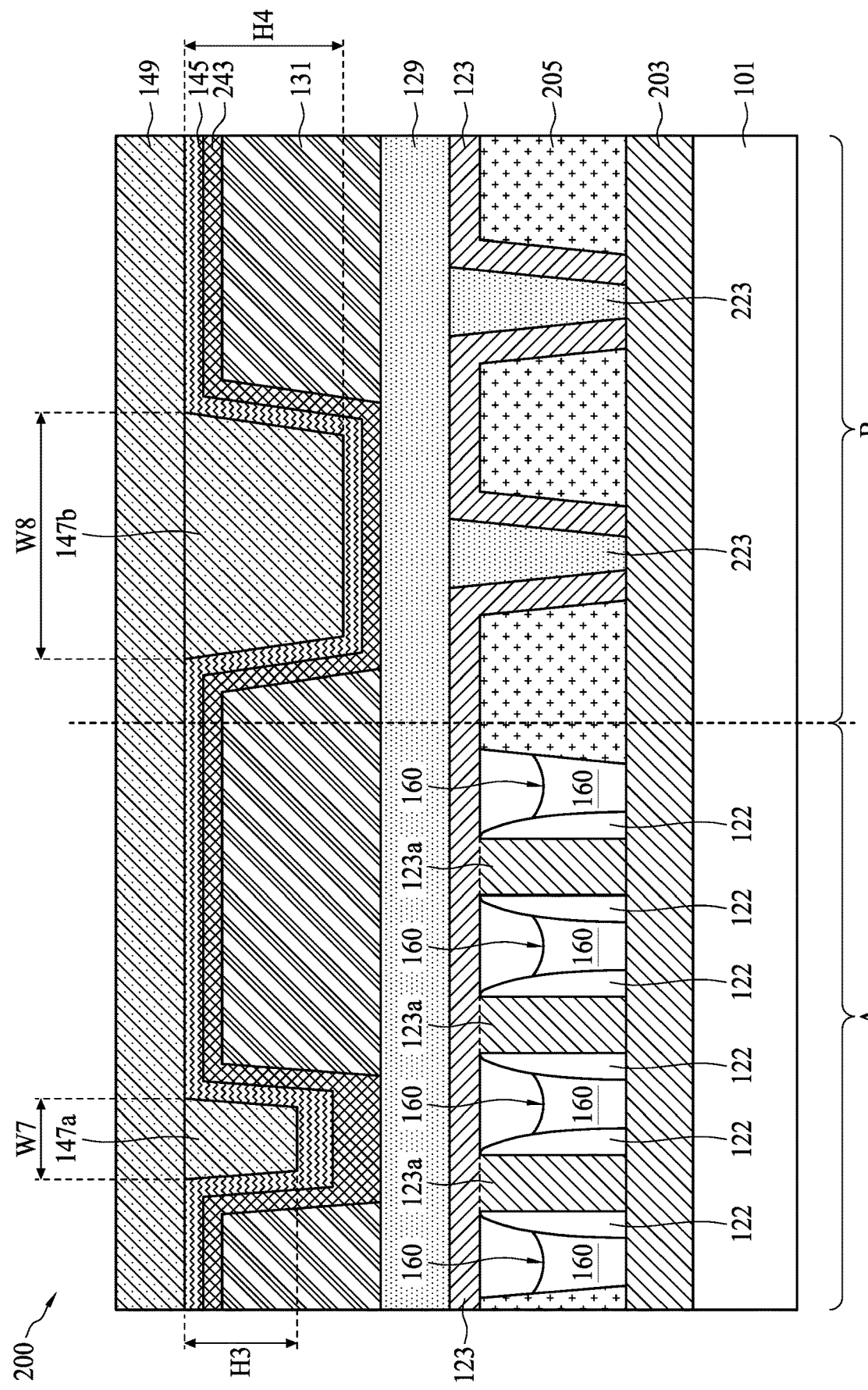
FIG. 40 is a cross-sectional view illustrating an intermediate stage of forming air gaps during the formation of the semiconductor structure, in accordance with some embodiments.

Referring to FIG. 39 or FIG. 40, in an embodiment with reference to FIG. 26, the semiconductor structure 200 is thus completed, in which the air gaps 160 have been present in the semiconductor structure 200 from FIG. 26 through FIG. 39 (or FIG. 40, since no further processes are performed in FIG. 40 in the embodiment with reference to FIG. 26).

Referring to FIG. 40, in another embodiment reference to FIG. 27, in which the energy removable layers 113 are present, a heat treatment is performed to transform the energy removable layers 113 into the air gaps 160. In some embodiments, energy removable structures 113' (see FIG. 21) are left surrounding the air gaps 160. The energy removable structures 113' are remaining portions of the energy removable layer 113 after the heat treatment. In some embodiments, the air gaps 160 are enclosed by the energy removable structures 113'. The semiconductor structure 200 along with the embodiment with reference to FIG. 27 is thus completed. The respective step is illustrated as the step S57 in the method 40 shown in FIG. 22.

In some other embodiment, the heat treatment can be replaced by a light treatment process, an e-beam treatment process, a combination thereof, or another applicable energy treatment process. After the air gaps 160 are formed, the semiconductor structure 200 is obtained.

The embodiments of the present disclosure have some advantageous features. By forming an air gap between the adjacent conductive plugs in the pattern-dense region, the parasitic capacitance between the conductive plugs in the pattern-dense region may be reduced. This significantly improves the overall device performance. In addition, the resistance of the conductive plugs in the pattern-loose region surrounded by the manganese-containing lining layer may be decreased. As a result, the operation speed of the semiconductor structure is increased, which significantly improves the overall device performance.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor structure, comprising:
a first conductive layer arranged over a substrate;
a second conductive layer arranged over the first conductive layer;
a plurality of first conductive plugs arranged over a pattern-dense region of the substrate and between the first conductive layer and the second conductive layer;
a plurality of spacers arranged on sidewalls of the respective first conductive plugs;
a plurality of air gaps arranged between the spacers;
a plurality of second conductive plugs arranged over a pattern-loose region of the substrate and between the first conductive layer and the second conductive layer; and
a lining layer arranged over the first conductive plugs and the second conductive plugs, wherein the lining layer and the first conductive plugs comprise a first material, and the second conductive plugs and the second conductive layer comprise a second material different from the first material;
wherein the plurality of first conductive plugs electrically connect the first conductive layer to the lining layer.

2. The semiconductor structure of claim 1, wherein the first material comprises copper manganese (CuMn), and the second material comprises copper (Cu).

3. The semiconductor structure of claim 1, further comprising a first dielectric layer arranged between the first conductive layer and the second conductive layer, wherein the second conductive plugs are surrounded by the first dielectric layer.

4. The semiconductor structure of claim 3, wherein the lining layer extends between the first dielectric layer and the second conductive layer.

5. The semiconductor structure of claim 3, wherein each of the plurality of second conductive plugs is in contact with the first conductive layer.

6. The semiconductor structure of claim 3, further comprising a plurality of second dielectric layers between the substrate and the second conductive layer, wherein the air gaps are between the substrate and the respective second dielectric layers.

7. The semiconductor structure of claim 6, wherein the second dielectric layers are leveled with the first dielectric layer.

8. The semiconductor structure of claim 6, further comprising a plurality of energy removable layers between the air gaps and the respective second dielectric layers.

* * * * *